(12) United States Patent
Asaba et al.

(10) Patent No.: US 12,218,215 B2
(45) Date of Patent: Feb. 4, 2025

(54) SEMICONDUCTOR DEVICE AND METHOD OF MANUFACTURING SEMICONDUCTOR DEVICE

(71) Applicants: TOSHIBA ELECTRONIC DEVICES & STORAGE CORPORATION, Tokyo (JP); KABUSHIKI KAISHA TOSHIBA, Tokyo (JP)

(72) Inventors: Shunsuke Asaba, Himeji Hyogo (JP); Yuji Kusumoto, Tatsuno Hyogo (JP); Katsuhisa Tanaka, Himeji Hyogo (JP); Yujiro Hara, Himeji Hyogo (JP); Makoto Mizukami, Ibo Hyogo (JP); Masaru Furukawa, Himeji Hyogo (JP); Hiroshi Kono, Himeji Hyogo (JP); Masanori Nagata, Himeji Hyogo (JP)

(73) Assignees: Toshiba Electronic Devices & Storage Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 394 days.

(21) Appl. No.: 17/681,410

(22) Filed: Feb. 25, 2022

(65) Prior Publication Data
US 2023/0086599 A1   Mar. 23, 2023

(30) Foreign Application Priority Data

Sep. 22, 2021   (JP) ................. 2021-154470

(51) Int. Cl.
*H01L 29/45*   (2006.01)
*H01L 21/04*   (2006.01)
(Continued)

(52) U.S. Cl.
CPC .......... *H01L 29/45* (2013.01); *H01L 21/0465* (2013.01); *H01L 21/0485* (2013.01);
(Continued)

(58) Field of Classification Search
CPC .................................................. H01L 29/7802
See application file for complete search history.

(56) References Cited

U.S. PATENT DOCUMENTS 9,219,127 B2   12/2015   Nakano
10,734,483 B2 *  8/2020   Mizukami ............... H01L 29/45
(Continued)

FOREIGN PATENT DOCUMENTS

JP   2006066439 A   3/2006
JP   2006128191 A   5/2006
(Continued)

OTHER PUBLICATIONS

Japanese Office Action dated May 21, 2024, mailed in counterpart Japanese Application No. 2021-154470, 14 pages (with translation).
(Continued)

*Primary Examiner* — Mounir S Amer
(74) *Attorney, Agent, or Firm* — Kim & Stewart LLP

(57) ABSTRACT

A semiconductor device includes a first silicon carbide region of a first conductivity type, a second silicon carbide region of a second conductivity type on the first region, and a third silicon carbide region of a second conductivity type on the second region. Fourth and fifth silicon carbide region of the first conductivity type are on the third region. A first electrode has a first portion between the fourth region and fifth region in a first direction. A metal silicide layer is between the first portion and the third region, between the first portion and the fourth region in the first direction, and between the first portion and the fifth silicon carbide region in the first direction.

17 Claims, 21 Drawing Sheets

(51) Int. Cl.
    *H01L 29/10*     (2006.01)
    *H01L 29/16*     (2006.01)
    *H01L 29/66*     (2006.01)
    *H01L 29/78*     (2006.01)

(52) U.S. Cl.
    CPC ...... *H01L 29/1095* (2013.01); *H01L 29/1608* (2013.01); *H01L 29/66068* (2013.01); *H01L 29/7802* (2013.01)

(56) References Cited

U.S. PATENT DOCUMENTS

| | | | |
|---|---|---|---|
| 10,930,773 B2* | 2/2021 | Kono | H01L 29/41741 |
| 2012/0037922 A1* | 2/2012 | Kono | H01L 21/0465 |
| | | | 257/77 |
| 2012/0205670 A1 | 8/2012 | Kudou et al. | |
| 2014/0077232 A1 | 3/2014 | Hino et al. | |
| 2017/0077238 A1 | 3/2017 | Kono et al. | |
| 2017/0077285 A1 | 3/2017 | Uehara | |
| 2017/0271467 A1 | 9/2017 | Kono et al. | |
| 2018/0197983 A1* | 7/2018 | Kinoshita | H01L 29/78 |
| 2018/0358463 A1 | 12/2018 | Kobayashi et al. | |
| 2019/0096998 A1 | 3/2019 | Fujii et al. | |
| 2021/0184030 A1* | 6/2021 | Tanaka | H01L 29/41766 |
| 2022/0013638 A1* | 1/2022 | Tanaka | H01L 29/41766 |

FOREIGN PATENT DOCUMENTS

| | | |
|---|---|---|
| JP | 5408248 B2 | 2/2014 |
| JP | 5653519 B2 | 1/2015 |
| JP | 2017055011 A | 3/2017 |
| JP | 2017059600 A | 3/2017 |
| JP | 6168370 B2 | 7/2017 |
| JP | 2019003968 A | 1/2019 |
| JP | 2019057682 A | 4/2019 |
| JP | 2019129300 A | 8/2019 |
| WO | 2011048800 A1 | 4/2011 |

OTHER PUBLICATIONS

Extended European Search Report dated Aug. 3, 2022, mailed in counterpart European Application No. 22158435.2, 12 pages.

* cited by examiner

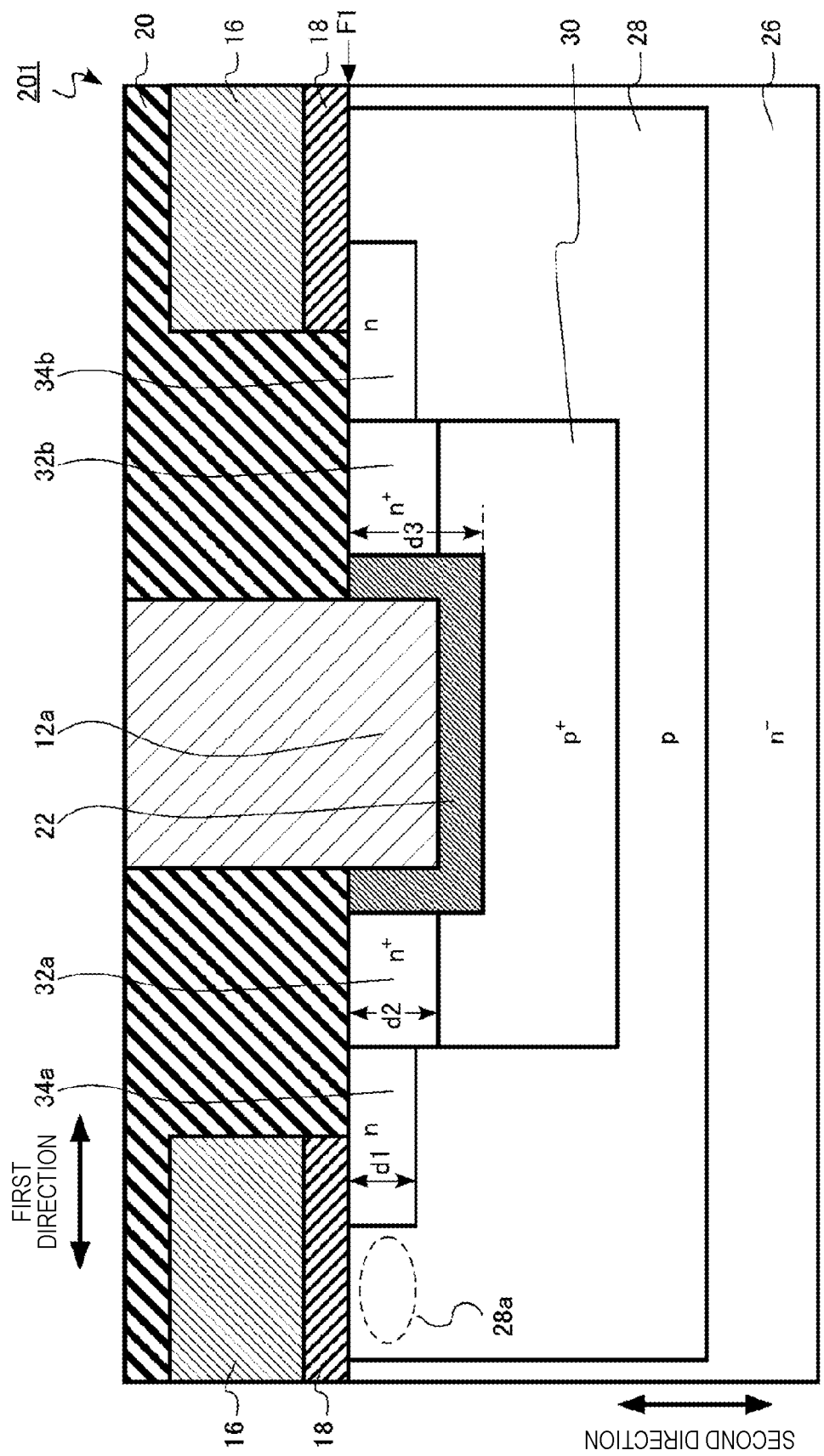

SEMICONDUCTOR DEVICE AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2021-154470, filed Sep. 22, 2021, the entire contents of which are incorporated herein by reference.

FIELD

Embodiments described herein relate generally to a semiconductor device and a method of manufacturing the semiconductor device.

BACKGROUND

Silicon carbide (SiC) is expected as a material for the next-generation semiconductor device. Silicon carbide has excellent physical properties such as a band gap of three times that of silicon, a breakdown electric field intensity of about ten times that of silicon, and thermal conductivity of about three times that of silicon. By utilizing these characteristics, it is possible to provide a power semiconductor device having a high withstand voltage, low loss, and high-temperature operation.

In a metal oxide semiconductor field effect transistor (MOSFET) using silicon carbide, it is desired to reduce the contact resistance. By reducing the contact resistance, the steady-state loss and switching losses of the MOSFET are reduced.

BRIEF DESCRIPTION OF THE DRAWINGS

FIG. 21 is an enlarged schematic cross-sectional view of a modification of a semiconductor device according to a second embodiment.

DETAILED DESCRIPTION

Figure 1:
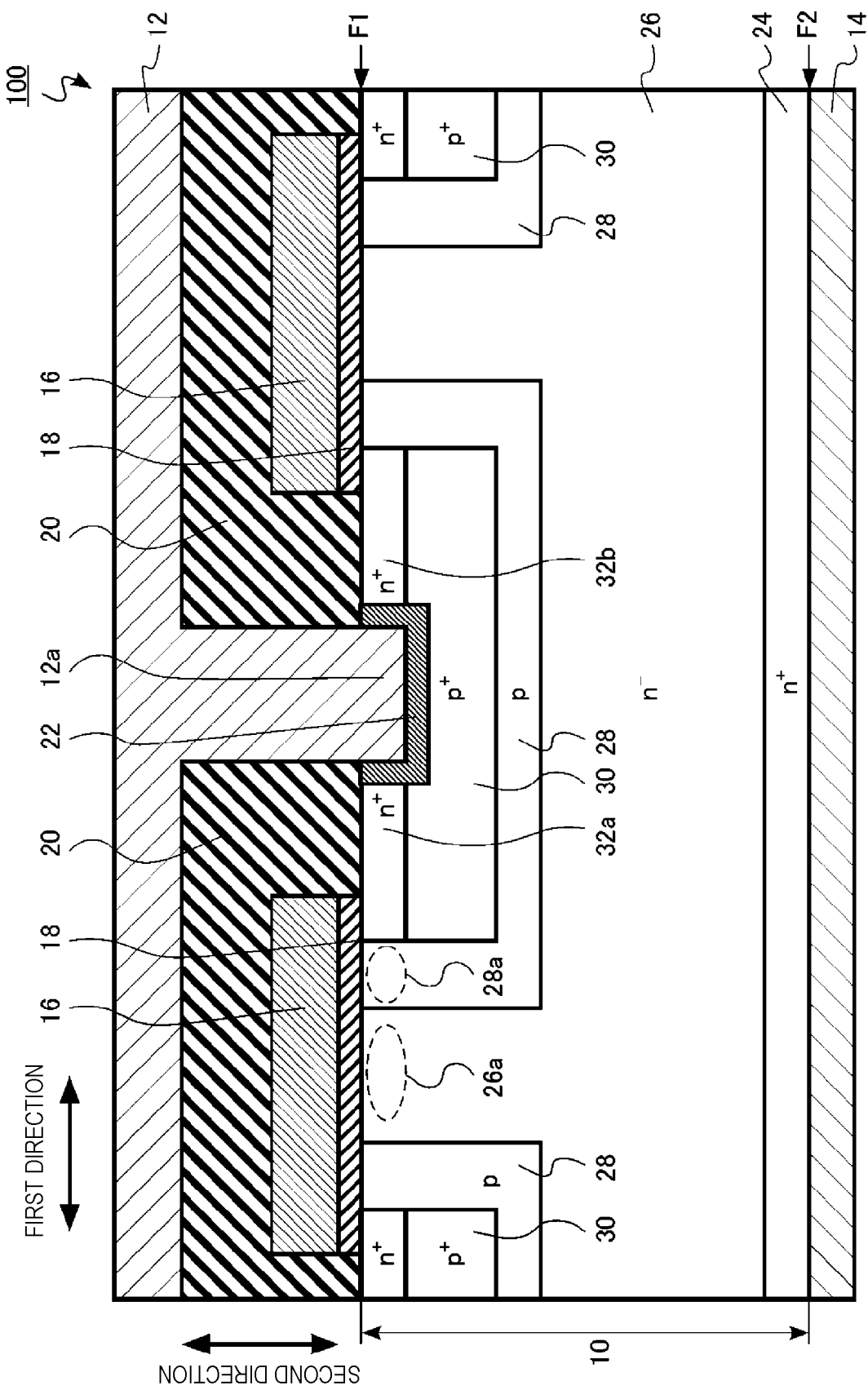
FIG. 1 is a schematic cross-sectional view of a semiconductor device according to a first embodiment.

Embodiments provide a semiconductor device having reduced contact resistance.

In general, according to one embodiment, a semiconductor device includes a silicon carbide layer having a first face and a second face facing the first face and including a first silicon carbide region of a first conductivity type including a first region in contact with the first face, a second silicon carbide region of a second conductivity type between the first silicon carbide region and the first face and including a second region in contact with the first face, and a third silicon carbide region of the second conductivity type between the second silicon carbide region and the first face and having a second conductivity type impurity concentration that is higher than a second conductivity type impurity concentration in the second silicon carbide region. A fourth silicon carbide region of the first conductivity type is provided between the third silicon carbide region and the first face and in contact with the first face. A fir fifth silicon carbide region of the first conductivity type is provided between the third silicon carbide region and the first face and in contact with the first face. The fifth silicon carbide region is provided in a first direction parallel to the first face from the fourth silicon carbide region. A gate electrode is provided on a first face side of the silicon carbide layer. The gate electrode faces the first region and the second region. A gate insulating layer is provided between the first region and the gate electrode and between the second region and the gate electrode. A first electrode is provided on the first face side of the silicon carbide layer and includes a first portion located between the fourth silicon carbide region and the fifth silicon carbide region in the first direction. A second electrode is provided on a second face side of the silicon carbide layer. A metal silicide layer is between the first portion and the third silicon carbide region, between the first portion and the fourth silicon carbide region in the first direction, and between the first portion and the fifth silicon carbide region in the first direction.

Hereinafter, certain example embodiments of the present disclosure will be described with reference to the drawings. In the following description, the same or similar components and aspects are denoted by the same reference numerals, and explanation for a component or aspect once described will be omitted as appropriate from subsequent description of drawings and/or embodiments.

In the following description, the notations of $n^+$, $n$, $n^-$, $p^+$, $p$, and $p^-$, indicate the relative level of the impurity concentration in each respective conductivity type (n-type or p-type). That is, $n^+$ indicates that the n-type impurity concentration is relatively higher than that of $n$, and $n^-$ indicates that the n-type impurity concentration is relatively lower than that of $n$. Furthermore, $p^+$ indicates that the p-type impurity concentration is relatively higher than that of $p$, and $p^-$ indicates that the p-type impurity concentration is relatively lower than that of $p$. In some cases, the $n^+$-type and the $n^-$-type are simply referred to as the n-type, and the $p^+$-type and the $p^-$-type are simply referred to as the p-type.

The impurity concentration may be measured by, for example, secondary ion mass spectrometry (SIMS). The relative level of impurity concentration may be determined from, for example, the level of a carrier concentration obtained by scanning capacitance microscopy (SCM). Distances such as the width and depth of an impurity region may be obtained by, for example, SIMS. The distances such as the width and depth of the impurity region may be obtained from, for example, an image from a SCM or an image from a scanning electron microscope (SEM). The thickness and other dimensions of an insulating layer can be measured on, for example, the image of SIMS, SEM, or transmission electron microscope (TEM).

In the present disclosure, a p-type impurity concentration in a p-type silicon carbide region refers to the net p-type impurity concentration obtained by subtracting the n-type impurity level in the region from the p-type impurity level in the region. Likewise, an n-type impurity concentration in an n-type silicon carbide region refers to the net n-type impurity concentration obtained by subtracting the p-type impurity level in the region from the n-type impurity level in the region.

Unless otherwise stated in the disclosure, the described impurity concentration within a specific region refers to the maximum impurity concentration in the specific region.

First Embodiment

A semiconductor device according to a first embodiment includes: a silicon carbide layer including a first conductivity type first silicon carbide region including a first region in contact with a first face, a second conductivity type second silicon carbide region provided between the first silicon carbide region and the first face and including a second region in contact with the first face, a second conductivity type third silicon carbide region provided between the second silicon carbide region and the first face and having a second conductivity type impurity concentration higher than a second conductivity type impurity concentration in the second silicon carbide region, a first conductivity type fourth silicon carbide region provided between the third silicon carbide region and the first face and configured to be in contact with the first face, and a first conductivity type fifth silicon carbide region provided between the third silicon carbide region and the first face, configured to be in contact with the first face, and provided in a first direction parallel to the first face with respect to the fourth silicon carbide region; a gate electrode provided on a side of the first face of the silicon carbide layer and facing the first region and the second region; a gate insulating layer provided between the first region and the gate electrode and between the second region and the gate electrode; a first electrode provided on a side of the first face of the silicon carbide layer and including a first portion located between the fourth silicon carbide region and the fifth silicon carbide region in the first direction; a second electrode provided on a side of a second face of the silicon carbide layer; and a metal silicide layer provided between the first portion and the third silicon carbide region, configured to be in contact with the third silicon carbide region in a second direction, provided between the first portion and the fourth silicon carbide region in the first direction, configured to be in contact with the fourth silicon carbide region, provided between the first portion and the fifth silicon carbide region in the first direction, and configured to be in contact with the fifth silicon carbide region.

The semiconductor device according to the first embodiment is a MOSFET 100. The MOSFET 100 is a double implantation MOSFET (DIMOSFET) with a body region and a source region formed by ion implantation. The MOSFET 100 is an re-channel MOSFET having electrons as carriers. Hereinafter, descriptions will be made on a case where the first conductivity type is an n-type and the second conductivity type is a p-type, as one example.

Figure 2:
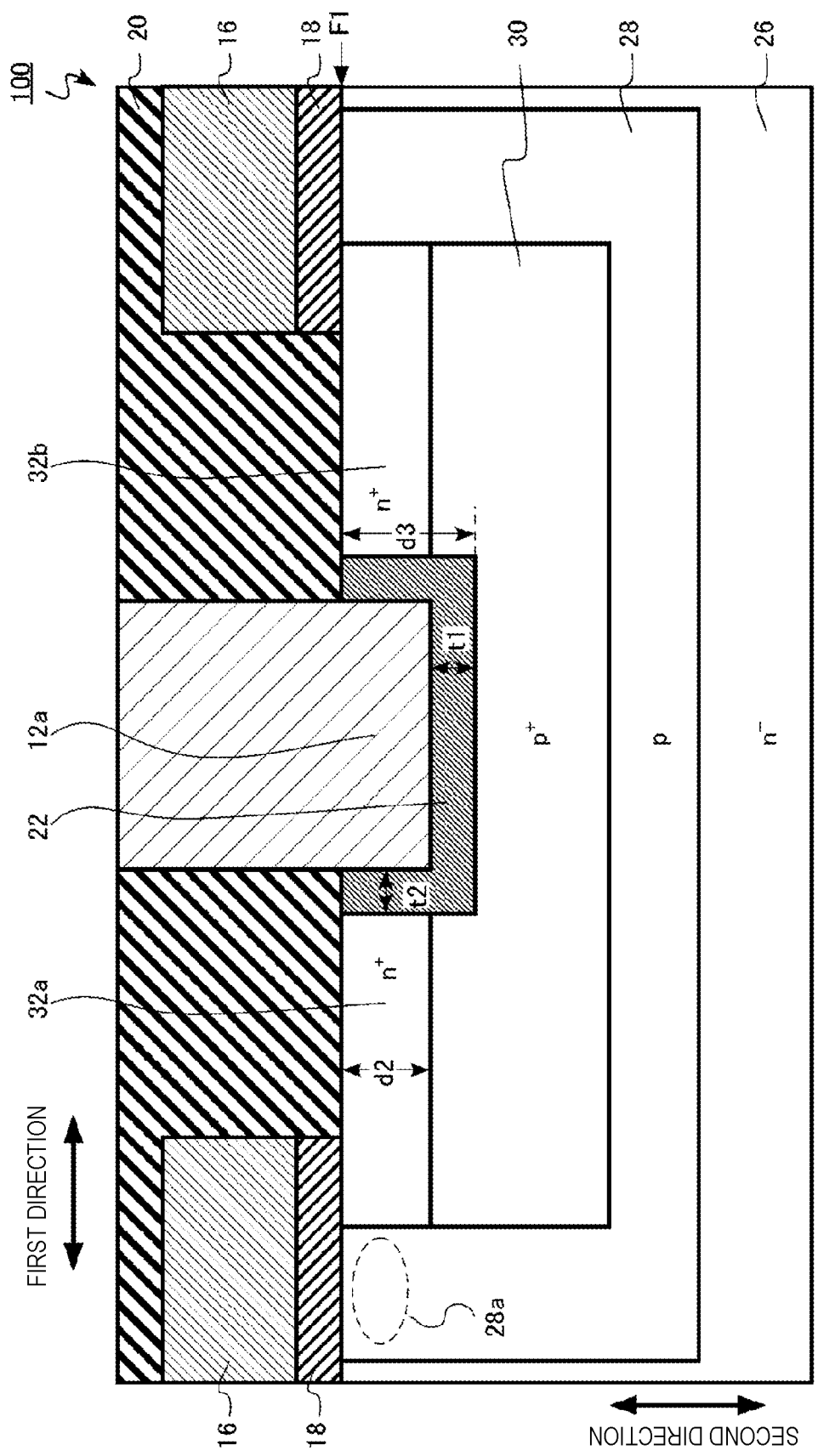
FIG. 2 is an enlarged schematic cross-sectional view of a semiconductor device according to a first embodiment.

FIG. 1 is a schematic cross-sectional view of the semiconductor device according to the first embodiment. FIG. 2 is an enlarged schematic cross-sectional view of the semiconductor device according to the first embodiment. FIG. 2 is an enlarged cross-sectional view of a portion of FIG. 1.

The MOSFET 100 includes a silicon carbide layer 10, a source electrode 12, a drain electrode 14, a gate electrode 16, a gate insulating layer 18, an interlayer insulating layer 20, and a metal silicide layer 22. The source electrode 12 includes a first portion 12a.

The silicon carbide layer 10 includes an $n^+$-type drain region 24, an $n^-$-type drift region 26 (first silicon carbide region), a p-type body region 28 (second silicon carbide region), and a $p^+$-type contact region 30 (third silicon carbide region), an $n^+$-type first source region 32a (fourth silicon carbide region), and an $n^+$-type second source region 32b (fifth silicon carbide region). The drift region 26 includes a first region 26a. The body region 28 includes a second region 28a.

The silicon carbide layer 10 is provided between the source electrode 12 and the drain electrode 14. The silicon carbide layer 10 includes a first face F1 and a second face F2.

The second face F2 faces the first face F1. The second face F2 is parallel to the first face F1.

A first direction is a direction parallel to the first face F1. A second direction is a direction from the first face F1 toward the second face F2. The second direction is the normal direction of the first face F1.

As used herein, the term "depth" refers to a distance from the first face F1 in the second direction. That is, a "depth" is a distance in the second direction from the first face F1 to another element or aspect. The second direction can be referred to as a depth direction of the silicon carbide layer 10.

The silicon carbide layer 10 is a single crystal SiC. The silicon carbide layer 10 is, for example, 4H—SiC. The first face F1 of the silicon carbide layer 10 is, for example, a face inclined by 0 degrees to 8 degrees with respect to a silicon face. The silicon face is a (0001) face. The thickness of the silicon carbide layer 10 along the second direction is, for example, 3 μm to 500 μm.

The source electrode 12 is provided on the first face F1 side of the silicon carbide layer 10. The source electrode 12 is provided on the first face F1 of the silicon carbide layer 10.

The source electrode 12 has the first portion 12a. The first portion 12a is provided between the first source region 32a and the second source region 32b in the first direction. The first portion 12a is in contact with the metal silicide layer 22.

The source electrode 12 is electrically connected to the first source region 32a and the second source region 32b. The source electrode 12 is electrically connected to the contact region 30.

The source electrode 12 comprises metal. The source electrode 12 comprises, for example, a stacked structure of a barrier metal layer and a metal layer.

The barrier metal layer comprises, for example, titanium (Ti), tungsten (W), or tantalum (Ta). The barrier metal layer is, for example, a titanium layer, a titanium nitride layer, a tungsten nitride layer, or a tantalum nitride layer.

The metal layer comprises, for example, aluminum (Al). The metal layer is, for example, an aluminum layer.

The drain electrode 14 is provided on the second face F2 side of the silicon carbide layer 10. The drain electrode 14 is provided on the second face F2 of the silicon carbide layer 10. The drain electrode 14 is in contact with the second face F2.

The drain electrode 14 comprises, for example, a metal or a metal semiconductor compound. The drain electrode 14 is, for example, a nickel silicide layer, a titanium layer, a nickel layer, a silver layer, or a gold layer.

The drain electrode 14 is electrically connected to the drain region 24. The drain electrode 14 is in contact with, for example, the drain region 24.

The gate electrode 16 is provided on the first face F1 side of the silicon carbide layer 10. The gate electrode 16 is repeatedly disposed in the first direction. The gate electrode 16 extends in a direction parallel to the first face F1 and perpendicular to the first direction, for example.

The gate electrode 16 faces the first face F1. The gate electrode 16 faces the first region 26a of the drift region 26. The gate electrode 16 faces the second region 28a of the body region 28.

The gate electrode 16 is a conductive layer. The gate electrode 16 comprises, for example, polycrystalline silicon containing p-type impurities or n-type impurities. The gate electrode 16 is, for example, a polycrystalline silicon layer.

The gate insulating layer 18 is provided between the gate electrode 16 and the silicon carbide layer 10. The gate insulating layer 18 is provided between the first region 26a of the drift region 26 and the gate electrode 16 and between the second region 28a of the body region 28 and the gate electrode 16.

The gate insulating layer 18 is, for example, silicon oxide. The gate insulating layer 18 is, for example, a silicon oxide layer. A high dielectric constant insulating material may be used as the gate insulating layer 18 in some examples. A stacked structure of a silicon oxide layer and a high dielectric constant insulating layer may be used for the gate insulating layer 18.

The thickness of the gate insulating layer 18 in the second direction is, for example, 30 nm to 100 nm.

The interlayer insulating layer 20 is provided on the gate electrode 16. The interlayer insulating layer 20 is provided between the gate electrode 16 and the source electrode 12. The interlayer insulating layer 20 is provided between the gate electrode 16 and the source electrode 12 in the first direction.

The interlayer insulating layer 20 electrically separates the gate electrode 16 and the source electrode 12. The interlayer insulating layer 20 comprises, for example, silicon oxide. The interlayer insulating layer 20 is, for example, a silicon oxide layer.

The $n^+$-type drain region 24 is provided on the second face F2 side of the silicon carbide layer 10. The drain region 24 comprises, for example, nitrogen (N) as an n-type impurity. The n-type impurity concentration in the drain region 24 is, for example, $1\times10^{18}$ cm$^{-3}$ to $1\times10^{21}$ cm$^{-3}$.

The $n^-$-type drift region 26 is provided on the drain region 24. The drift region 26 is provided between the drain region 24 and the first face F1.

A portion of the drift region 26 is in contact with the first face F1. The first region 26a of the drift region 26 is in contact with the first face F1. The first region 26a is in contact with the gate insulating layer 18.

The drift region 26 comprises, for example, nitrogen (N) as an n-type impurity. The n-type impurity concentration in the drift region 26 is lower than the n-type impurity concentration in the drain region 24. The n-type impurity concentration in the drift region 26 is, for example, $4\times10^{14}$ cm$^{-3}$ to $1\times10^{18}$ cm$^{-3}$.

The drift region 26 is, for example, a SiC epitaxial film formed on the drain region 24 by epitaxial growth. The thickness of the drift region 26 in the second direction is, for example, 3 µm to 500 µm.

The p-type body region 28 is provided between the drift region 26 and the first face F1. A portion of the body region 28 is in contact with the first face F1. The second region 28a of the body region 28 is in contact with the first face F1. The second region 28a is in contact with the gate insulating layer 18.

The second region 28a of the body region 28 functions as a channel forming region of the MOSFET 100. For example, when the MOSFET 100 is turned on, a channel through which electrons flow is formed in the second region 28a. The second region 28a becomes the channel forming region.

The body region 28 comprises, for example, aluminum (Al) as a p-type impurity. The p-type impurity concentration in the body region 28 is, for example, $5\times10^{16}$ cm$^{-3}$ to $5\times10^{19}$ cm$^{-3}$.

The depth of the body region 28 is, for example, 500 nm to 900 nm. A distance in the second direction from the first face F1 to an interface between the body region 28 and the drift region 26 is, for example, 500 nm to 900 nm.

The pt-type contact region 30 is provided between the body region 28 and the first face F1. The contact region 30 is provided between the body region 28 and the first source region 32a. The contact region 30 is provided between the body region 28 and the second source region 32b. The contact region 30 is provided between the body region 28 and the metal silicide layer 22.

The contact region 30 comprises, for example, aluminum (Al) as a p-type impurity. The p-type impurity concentration in the contact region 30 is higher than the p-type impurity concentration in the body region 28. The p-type impurity concentration in the contact region 30 is, for example, $1\times10^{19}$ cm$^{-3}$ to $5\times10^{21}$ cm$^3$.

The depth of the contact region 30 is, for example, 200 nm to 500 nm. A distance in the second direction from the first face F1 to an interface between the contact region 30 and the body region 28 is, for example, 200 nm to and 500 nm.

The $n^+$-type first source region 32a is provided between the contact region 30 and the first face F1. The first source region 32a is in contact with the first face F1. The first source region 32a is in contact with the metal silicide layer 22 in the first direction.

The first source region 32a comprises, for example, nitrogen (N) or phosphorus (P) as an n-type impurity. The n-type impurity concentration in the first source region 32a is higher than the n-type impurity concentration in the drift region 26. The n-type impurity concentration in the first source region 32a is, for example, $1\times10^{19}$ cm$^{-3}$ to $5\times10^{21}$ cm$^{-3}$.

The depth of the first source region 32a is shallower than the depth of the contact region 30. A distance in the second direction from the first face F1 to an interface between the first source region 32a and the contact region 30 is, for example, 80 nm to 200 nm.

The $n^+$-type second source region 32b is provided between the contact region 30 and the first face F1. The second source region 32b is provided in the first direction from the first source region 32a. The second source region 32b is in contact with the first face F1. The second source region 32b is in contact with the metal silicide layer 22 in the first direction.

The second source region 32b comprises, for example, nitrogen (N) or phosphorus (P) as an n-type impurity. The n-type impurity concentration in the second source region 32b is higher than the n-type impurity concentration in the drift region 26. The n-type impurity concentration in the second source region 32b is, for example, $1\times10^{19}$ cm$^{-3}$ to $5\times10^{21}$ cm$^{-}$.

The depth of the second source region 32b is shallower than the depth of the contact region 30. A distance in the second direction from the first face F1 to an interface between the second source region 32b and the contact region 30 is, for example, 80 nm to 200 nm.

The first portion 12a of the source electrode 12 is provided between the first source region 32a and the second source region 32b in the first direction.

The metal silicide layer 22 is provided between the first portion 12a of the source electrode 12 and the contact region 30. The metal silicide layer 22 is in contact with the contact region 30 in the second direction. The metal silicide layer 22 is in contact with the contact region 30 in the first direction, for example.

The metal silicide layer 22 is provided between the first portion 12a of the source electrode 12 and the first source region 32a in the first direction. The metal silicide layer 22 is in contact with the first source region 32a in the first direction.

The metal silicide layer 22 is provided between the first portion 12a of the source electrode 12 and the second source region 32b in the first direction. The metal silicide layer 22 is in contact with the second source region 32b in the first direction.

The depth of the metal silicide layer 22 is, for example, 100 nm to 300 nm. A third distance (d3 in FIG. 2) in the second direction from the first face F1 to an interface between the metal silicide layer 22 and the contact region is, for example, 100 nm to 300 nm.

The depth of the metal silicide layer 22 is deeper than the depth of the first source region 32a. The third distance d3 in the second direction from the first face F1 to the interface between the metal silicide layer 22 and the contact region 30 is longer than a second distance (d2 in FIG. 2) in the second direction from the first face F1 to the interface between the first source region 32a and the contact region 30.

The depth of the first source region 32a is, for example, more than half the depth of the metal silicide layer 22. The length of the second distance d2 is, for example, more than half of the third distance d3.

The first portion 12a of the source electrode 12 is sandwiched in-between the metal silicide layer 22 in the first direction. The position of an interface between the first portion 12a and the metal silicide layer 22 in the second direction is closer to the drain electrode 14 than the first face F1 in the second direction. In other words, the position of an interface between the source electrode 12 and the metal silicide layer 22 in the second direction is closer to the drain electrode 14 than the first face F1 in the second direction.

The metal silicide layer 22 comprises, for example, nickel (Ni), titanium (Ti), or cobalt (Co). The metal silicide layer 22 is, for example, a nickel silicide layer, a titanium silicide layer, or a cobalt silicide layer.

The thickness t1 (see FIG. 2) of the metal silicide layer 22 between the first portion 12a and the contact region 30 in the second direction is, for example, 30 nm to 90 nm. The thickness t2 (see FIG. 2) of the metal silicide layer 22 between the first portion 12a and the first source region 32a in the first direction is, for example, 30 nm to 120 nm. The thickness t2 of the metal silicide layer 22 between the first portion 12a and the first source region 32a in the first direction is, for example, 50 nm to 100 nm. The thickness of the metal silicide layer 22 between the first portion 12a and the second source region 32b in the first direction is, for example, 30 nm to 120 nm. The thickness of the metal silicide layer 22 between the first portion 12a and the second source region 32b in the first direction is, for example, 50 nm to 100 nm.

The thickness t1 of the metal silicide layer 22 between the first portion 12a and the contact region 30 in the second direction is thicker than the thickness t2 of the metal silicide layer 22 between the first portion 12a and the first source region 32a in the first direction, for example.

Figure 3B:
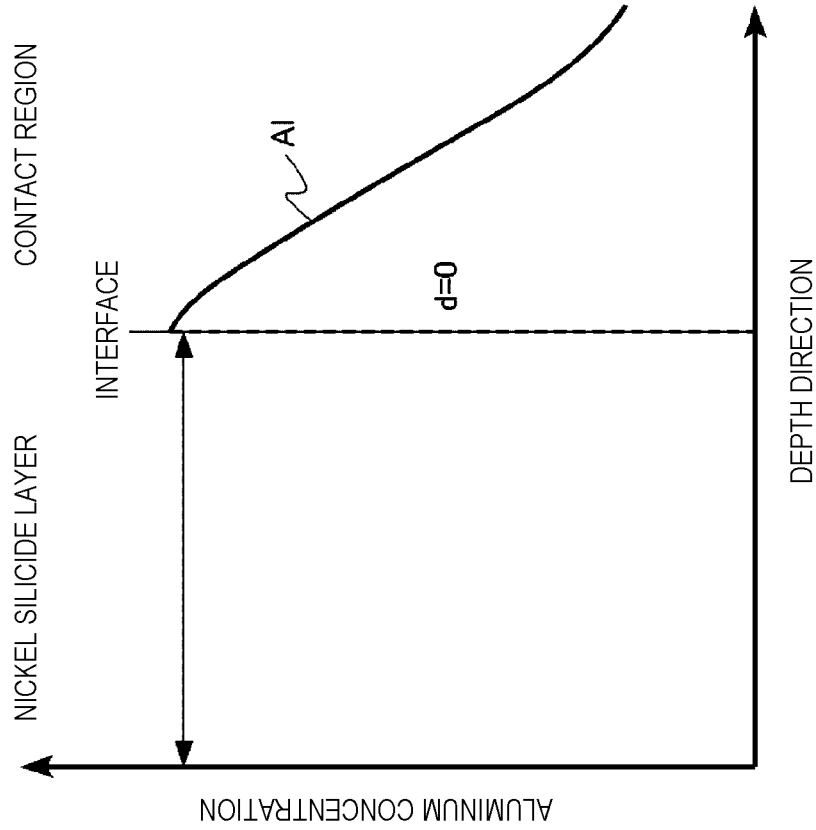
FIGS. 3A and 3B are diagrams illustrating an impurity concentration distribution in a semiconductor device according to a first embodiment.
Figure 3A:
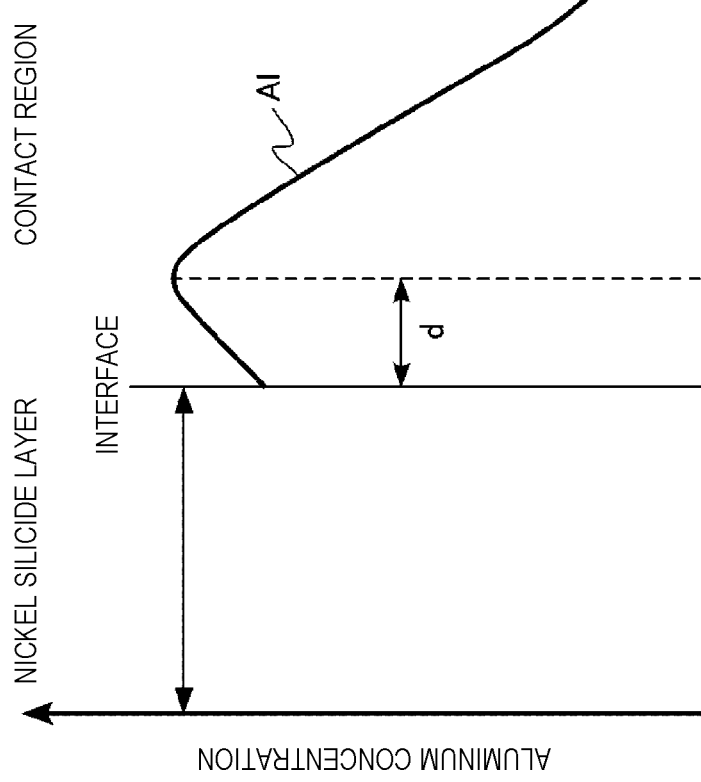

FIGS. 3A and 3B are diagrams illustrating an impurity concentration distribution of the semiconductor device according to the first embodiment. FIGS. 3A and 3B are diagrams illustrating a p-type impurity concentration in the depth direction of the p-type impurity concentration in the contact region 30.

FIGS. 3A and 3B illustrate a case where the p-type impurity is aluminum and the metal silicide layer 22 is a nickel silicide layer. FIG. 3A is a first example, and FIG. 3B is a second example.

In the MOSFET 100, as illustrated in FIGS. 3A and 3B, in the depth direction of the nickel silicide layer, a distance (d in FIG. 3A) in the depth direction between a position where the aluminum concentration in the contact region 30 is maximized and an interface between the nickel silicide layer and the contact region 30 is 50 nm or less. The second example is an example in which the position where the aluminum concentration in the contact region 30 is maximized coincides with a position of the interface between the nickel silicide layer and the contact region 30.

Next, an example of a method of manufacturing the semiconductor device according to the first embodiment will be described.

A method of manufacturing a semiconductor device according to the first embodiment, includes: forming a first second conductivity type region by performing first ion implantation to ion-implant a second conductivity type impurity into a first conductivity type silicon carbide layer; forming another second conductivity type region shallower than the first second conductivity type region and having a second conductivity type impurity concentration higher than that of the first second conductivity type region, by performing a second ion implantation to ion-implant the second conductivity type impurity into the first second conductivity type region; forming a first conductivity type region shallower than the second second conductivity type region, by performing a third ion implantation to ion-implant a first conductivity type impurity into the second second conductivity type region; forming a trench shallower than an interface between the second second conductivity type impurity region and the first second conductivity type impurity region, in the first conductivity type region; forming a metal film in the trench; and forming a metal silicide layer in contact with the second second conductivity type region and the first conductivity type region by performing heat treatment.

FIGS. 4, 5, 6, 7, 8, 9, 10, 11, 12, 13, and 14 are schematic cross-sectional views illustrating an example of a method of manufacturing the semiconductor device according to the first embodiment. FIGS. 4 to 14 are cross-sectional views corresponding to FIG. 1.

Hereinafter, descriptions will be made on a case where a first conductivity type is n-type, a second conductivity type is p-type, a first conductivity type impurity is phosphorus (P), a second conductivity type impurity is aluminum (Al), a metal film is a nickel film, and a metal silicide layer is a nickel silicide layer, as an example.

Figure 4:
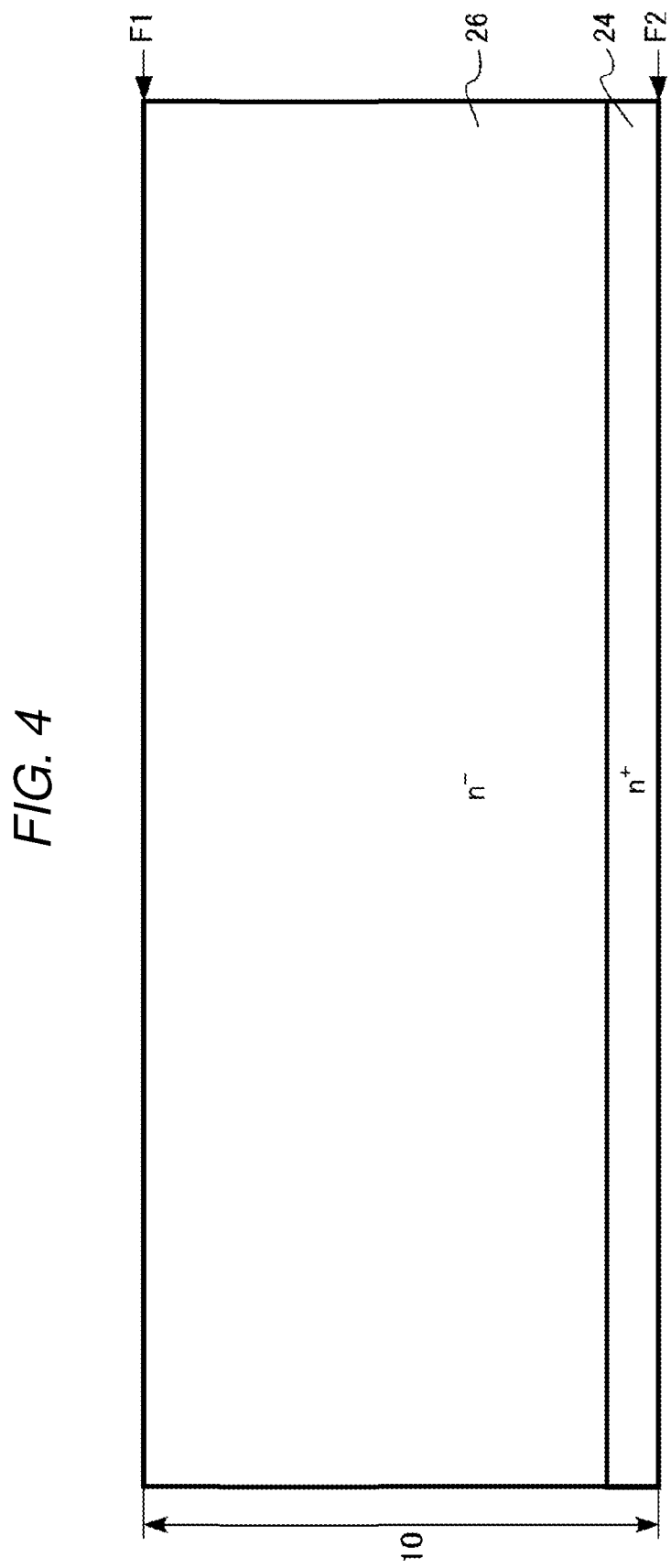
FIGS. 4-14 are schematic cross-sectional views illustrating aspects related to a method of manufacturing a semiconductor device according to a first embodiment.

First, the silicon carbide layer 10 having the n⁺-type drain region 24 and the n⁻-type drift region 26 formed on the drain region 24 by epitaxial growth is prepared (FIG. 4).

The silicon carbide layer 10 includes the first face ("F1" in FIG. 4) and the second face ("F2" in FIG. 4). Hereinafter, the first face F1 is also referred to as a front surface, and the second face F2 is also referred to as a back surface.

Next, a mask material 50 is formed on the front surface of the silicon carbide layer 10. The mask material 50 is, for example, a silicon oxide film.

Figure 5:
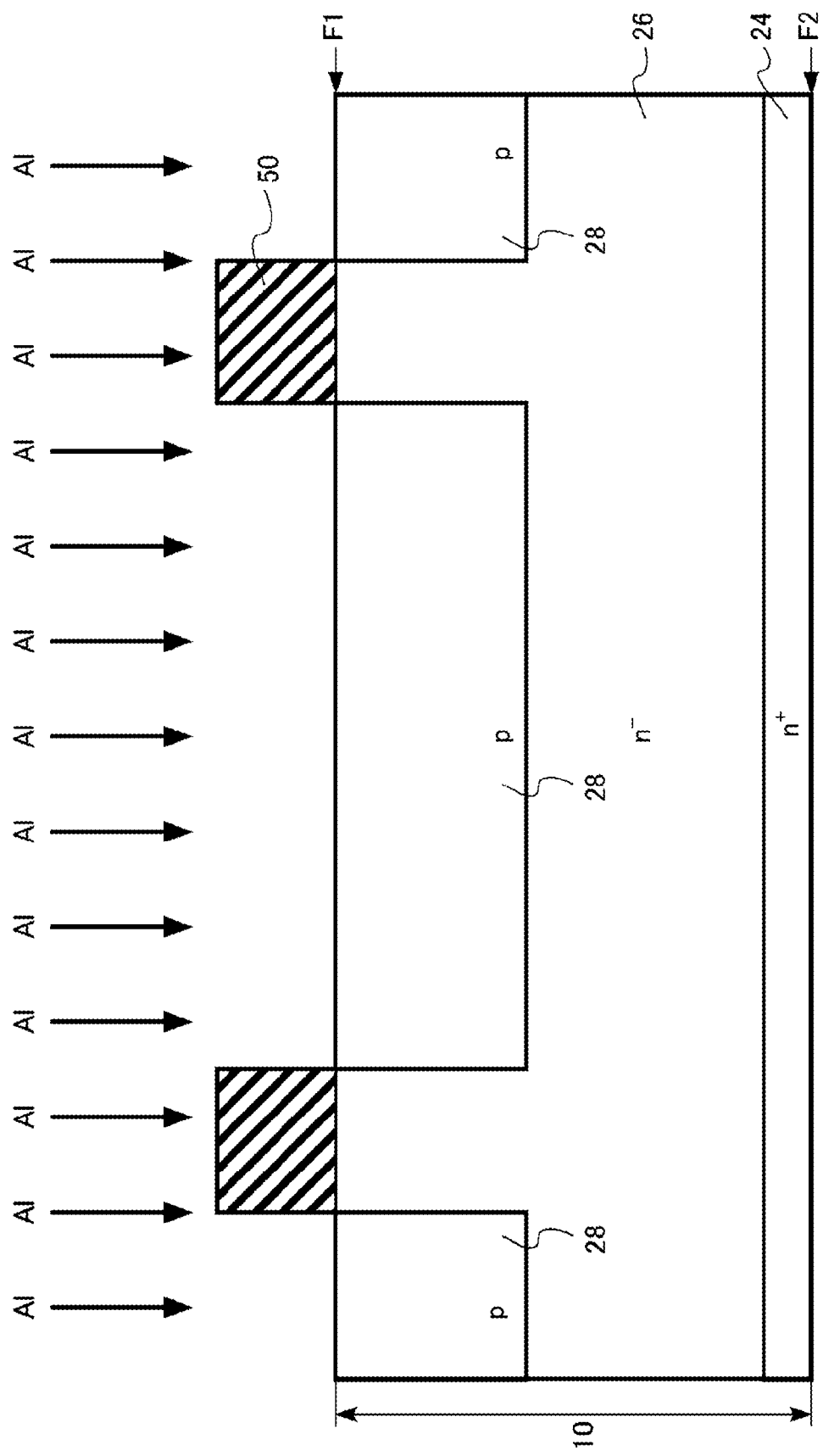

Next, first ion implantation is performed using the mask material 50 as a mask (FIG. 5). In the first ion implantation, aluminum (Al) is ion-implanted into the silicon carbide layer 10. The p-type body region 28 is formed by the first ion implantation. The p-type body region 28 is an example of a first second conductivity type region.

Next, the mask material 50 is stripped off, and a new mask material 52 is formed on the front surface of the silicon carbide layer 10. The mask material 52 is, for example, a silicon oxide film.

Figure 6:
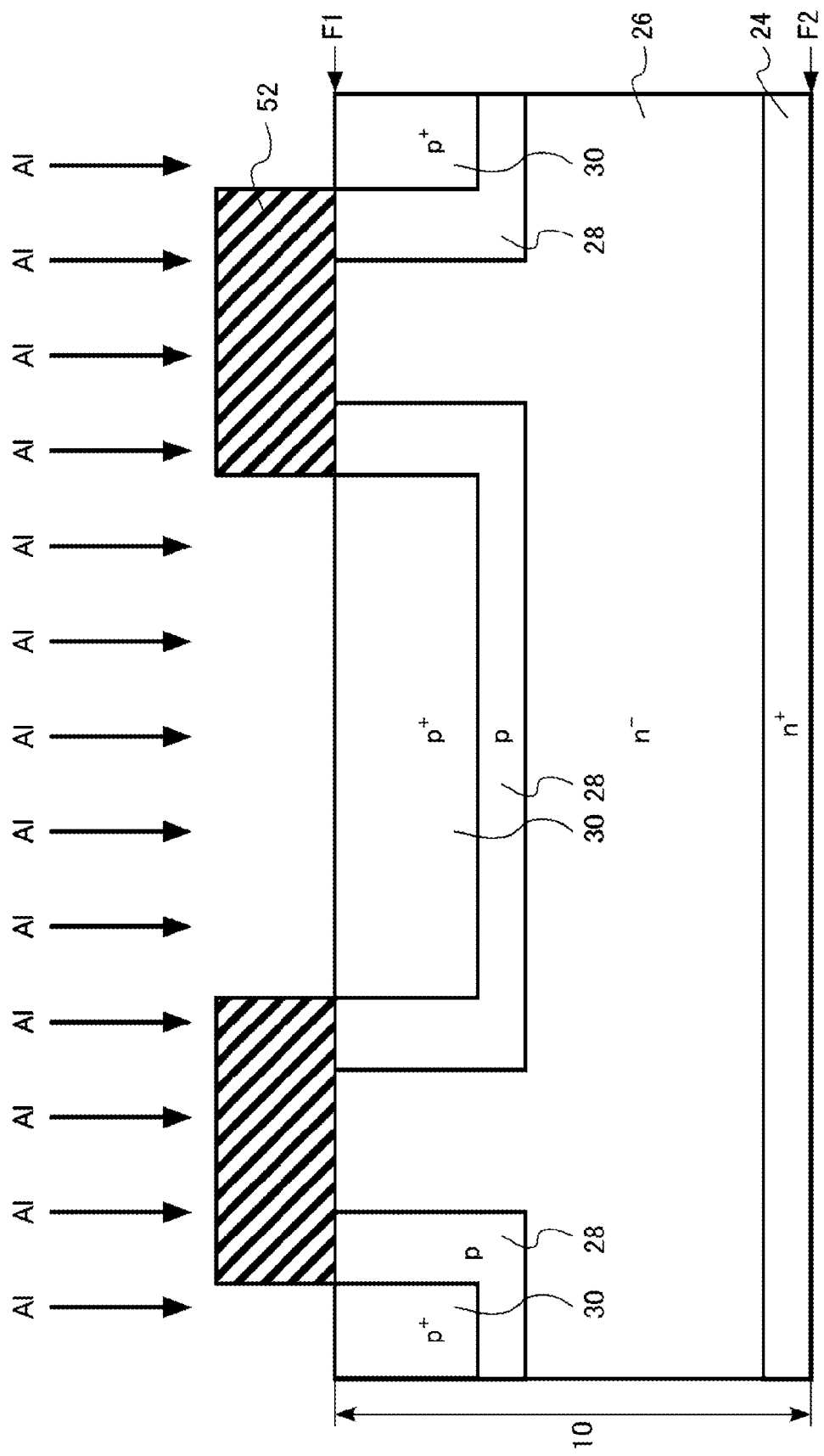

Next, second ion implantation is performed using the mask material 52 as a mask (FIG. 6). In the second ion implantation, aluminum (Al) is ion-implanted into the body region 28 of the silicon carbide layer 10. The pt-type contact region 30 shallower than the body region 28 is formed by the second ion implantation. The pt-type contact region 30 is an example of a second second conductivity type region.

Figure 7:
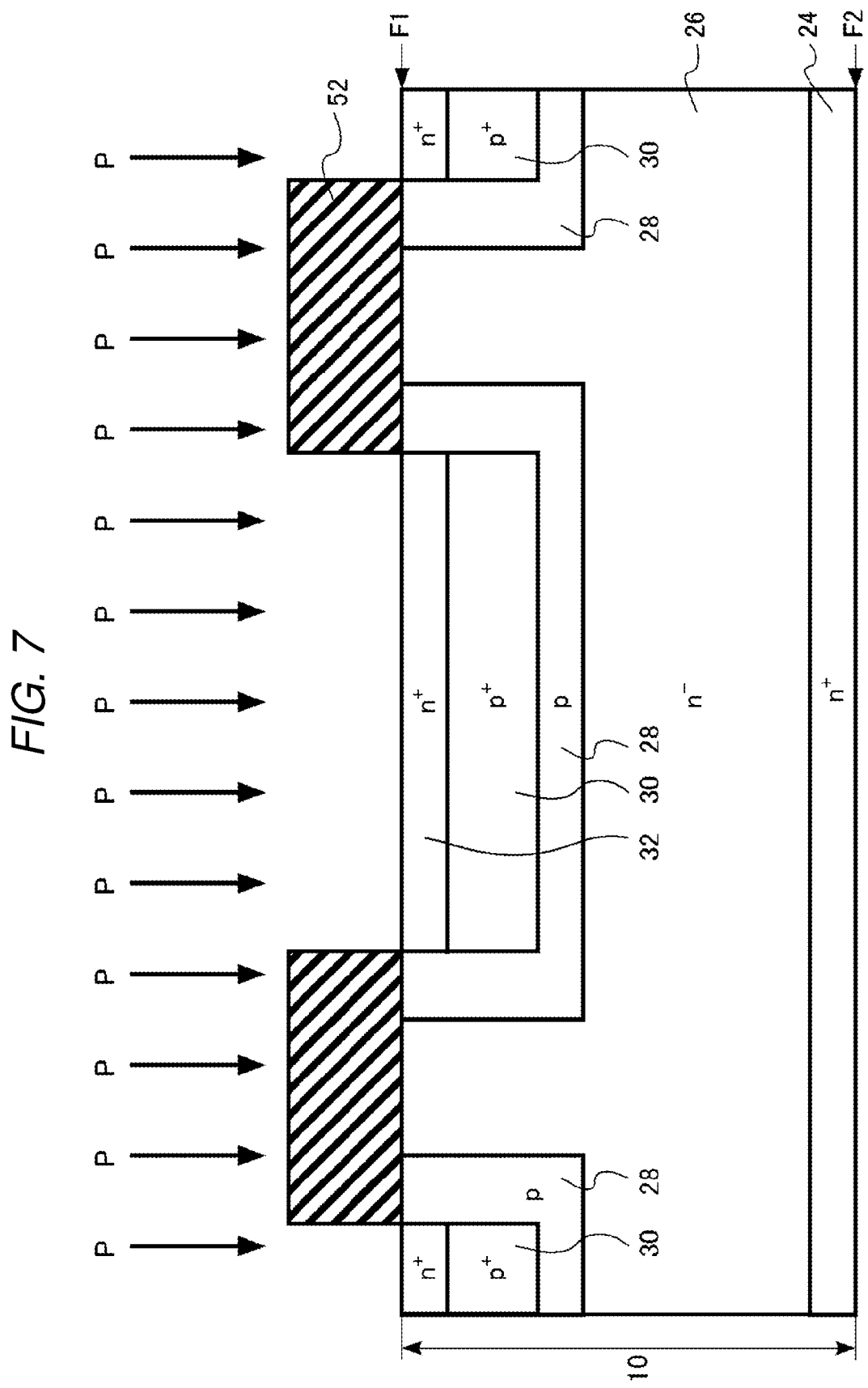

Next, third ion implantation is performed using the mask material 52 as a mask (FIG. 7). In the third ion implantation, phosphorus (P) is ion-implanted into the contact region 30 of the silicon carbide layer 10. The nt-type source region 32 shallower than the contact region 30 is formed by the third ion implantation. The nt-type source region 32 is an example of a first conductivity type region. A portion of the source region 32 finally becomes the first source region 32a and the second source region 32b.

Figure 8:
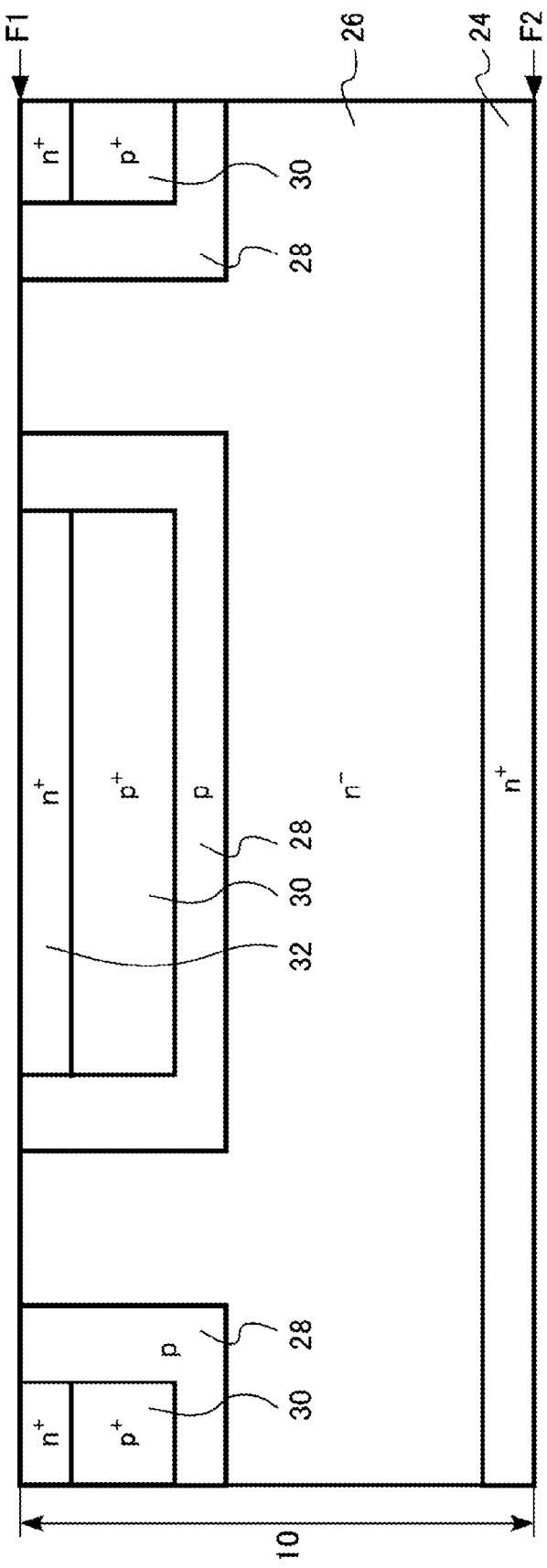

Next, the mask material 52 is stripped off (FIG. 8). Next, activation annealing of aluminum (Al), which is a p-type impurity, and phosphorus (P), which is an n-type impurity, is performed. The activation annealing is performed, for example, at a temperature of 1,500° C. or higher and 1,800° C. or lower in an argon atmosphere after forming a carbon film (not illustrated) on the front surface of the silicon carbide layer 10.

Figure 9:
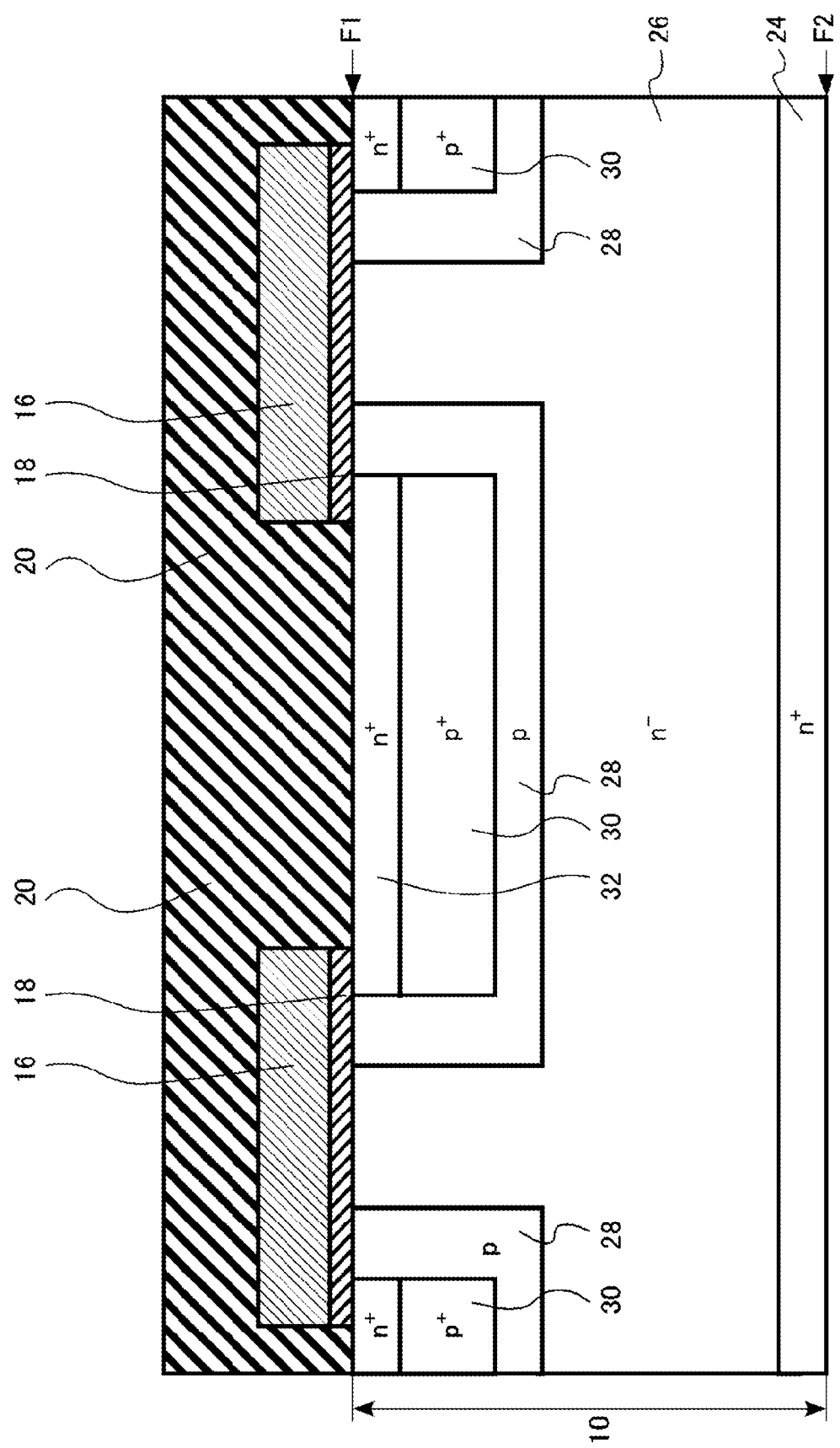

Next, the gate insulating layer 18, the gate electrode 16, and the interlayer insulating layer 20 are formed on the front surface of the silicon carbide layer 10 by using a known process technique (FIG. 9). The gate insulating layer 18 is, for example, a silicon oxide layer. The gate electrode 16 is, for example, a polycrystalline silicon layer. The interlayer insulating layer 20 is, for example, a silicon oxide layer.

Figure 10:
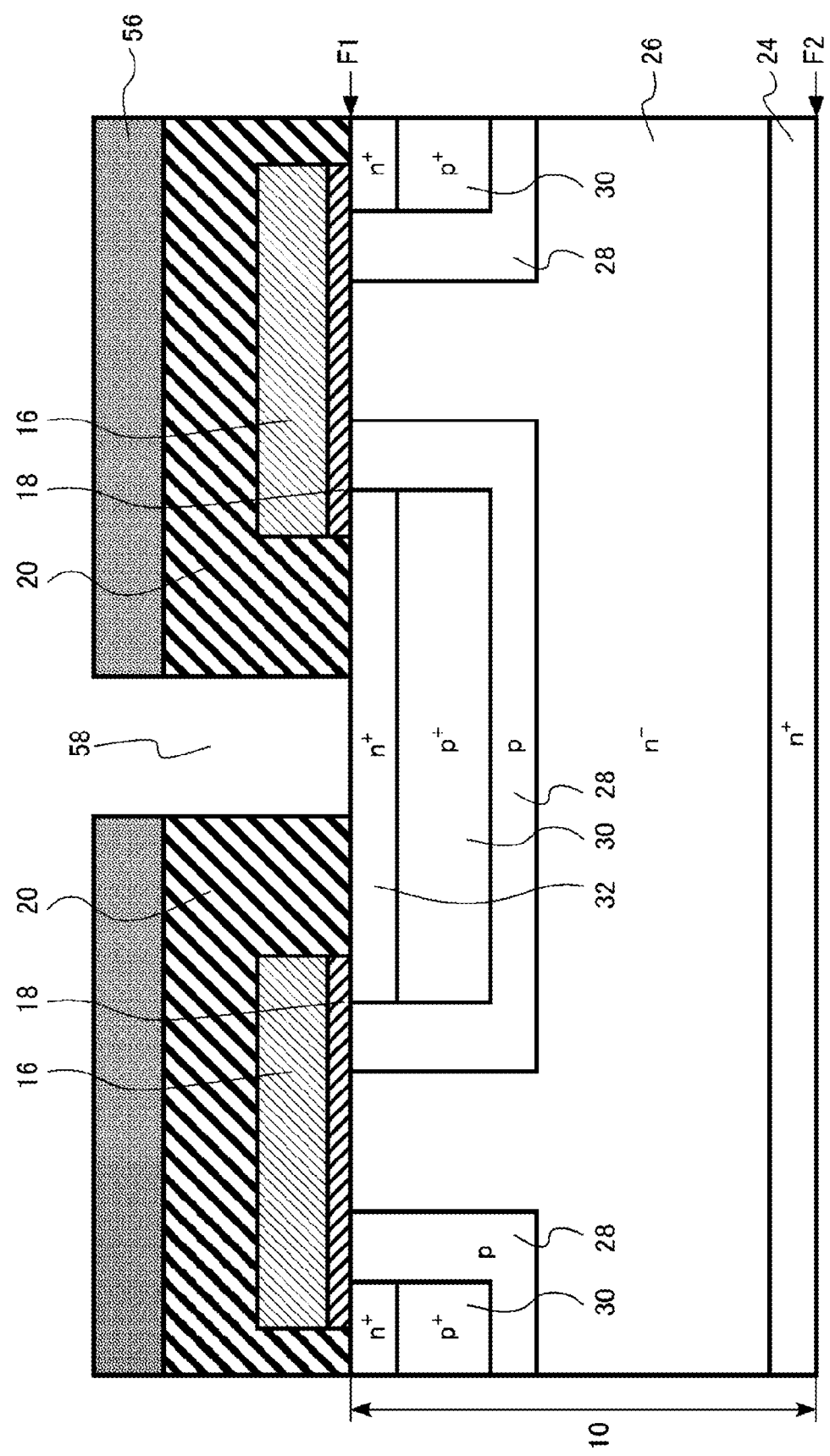

Next, a mask material 56 is formed on the front surface of the interlayer insulating layer 20. The mask material 56 is, for example, a photoresist. Next, using the mask material 56 as a mask, an opening 58 is formed in the interlayer insulating layer 20 (FIG. 10). The opening 58 is formed by etching the interlayer insulating layer 20 by, for example, a reactive ion etching method (RIE method).

Figure 11:
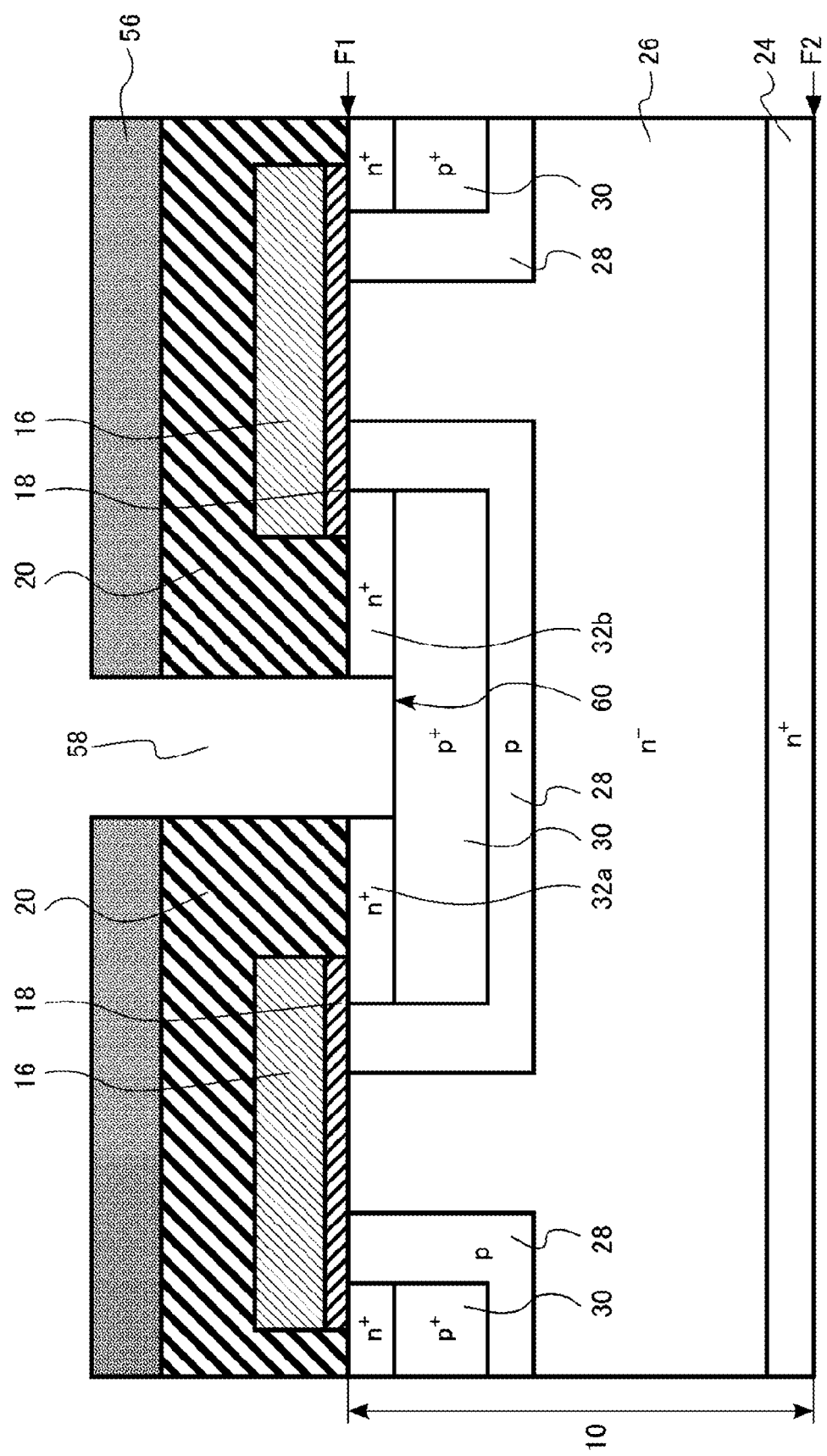

Next, using the mask material 56 as a mask, a trench 60 is formed under the opening 58 (FIG. 11). The trench 60 is formed by etching the source region 32 by, for example, the RIE method.

The depth of the trench 60 is shallower than the depth of the interface between the contact region 30 and the body region 28. The depth of the trench 60 is, for example, 100 nm to 140 nm. For example, the contact region 30 is exposed on the bottom surface of the trench 60.

The source region 32 is separated into the first source region 32a and the second source region 32b by the trench 60.

Figure 12:
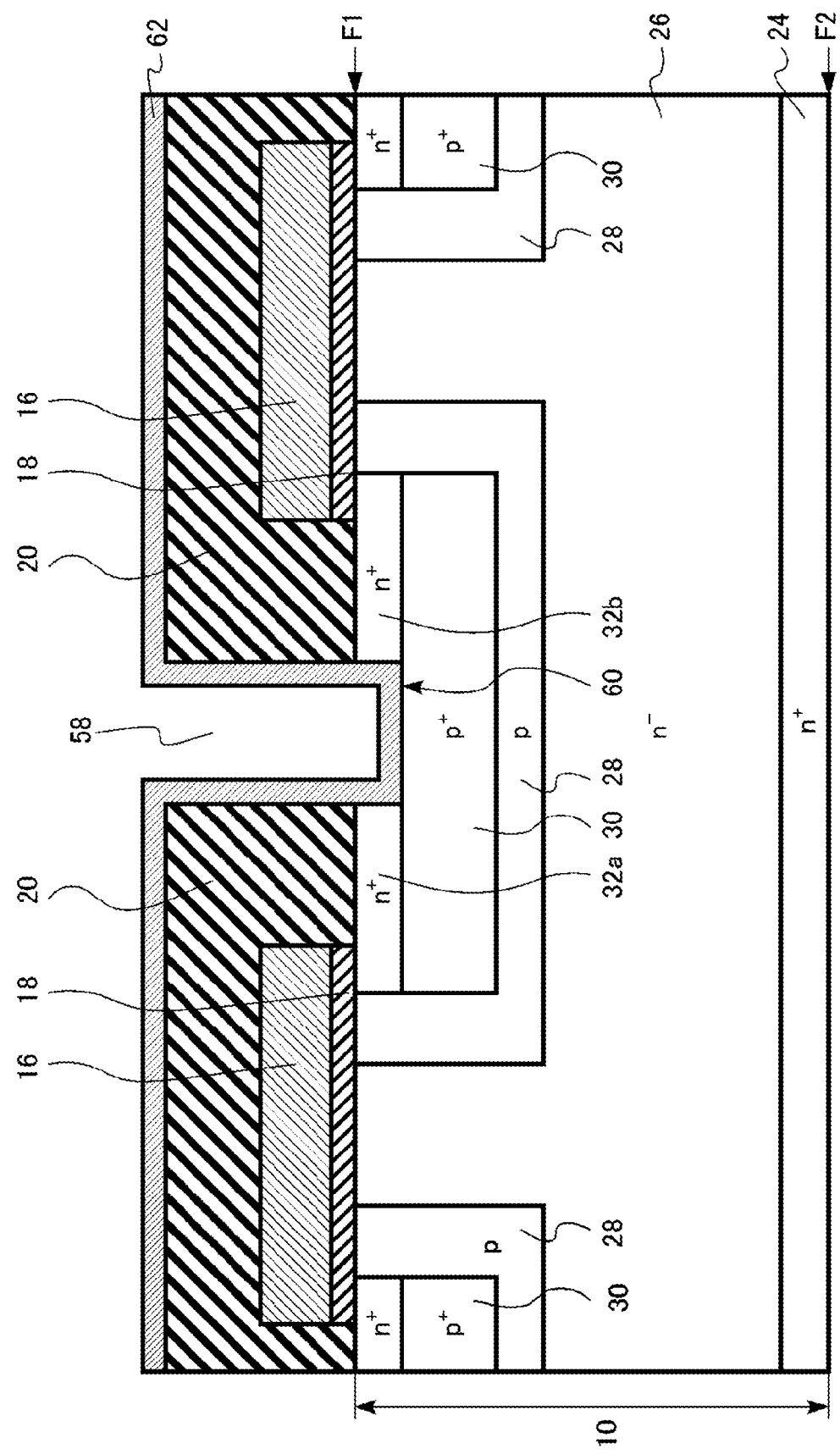

Next, the mask material 56 is stripped off. Next, a nickel film 62 is formed (FIG. 12). The nickel film 62 is formed by, for example, a sputtering method. The nickel film 62 is formed in the trench 60. The film thickness of the nickel film 62 is, for example, 30 nm to 120 nm. The film thickness of the nickel film 62 is, for example, 50 nm to 100 nm. The nickel film 62 is an example of a metal film.

Figure 13:
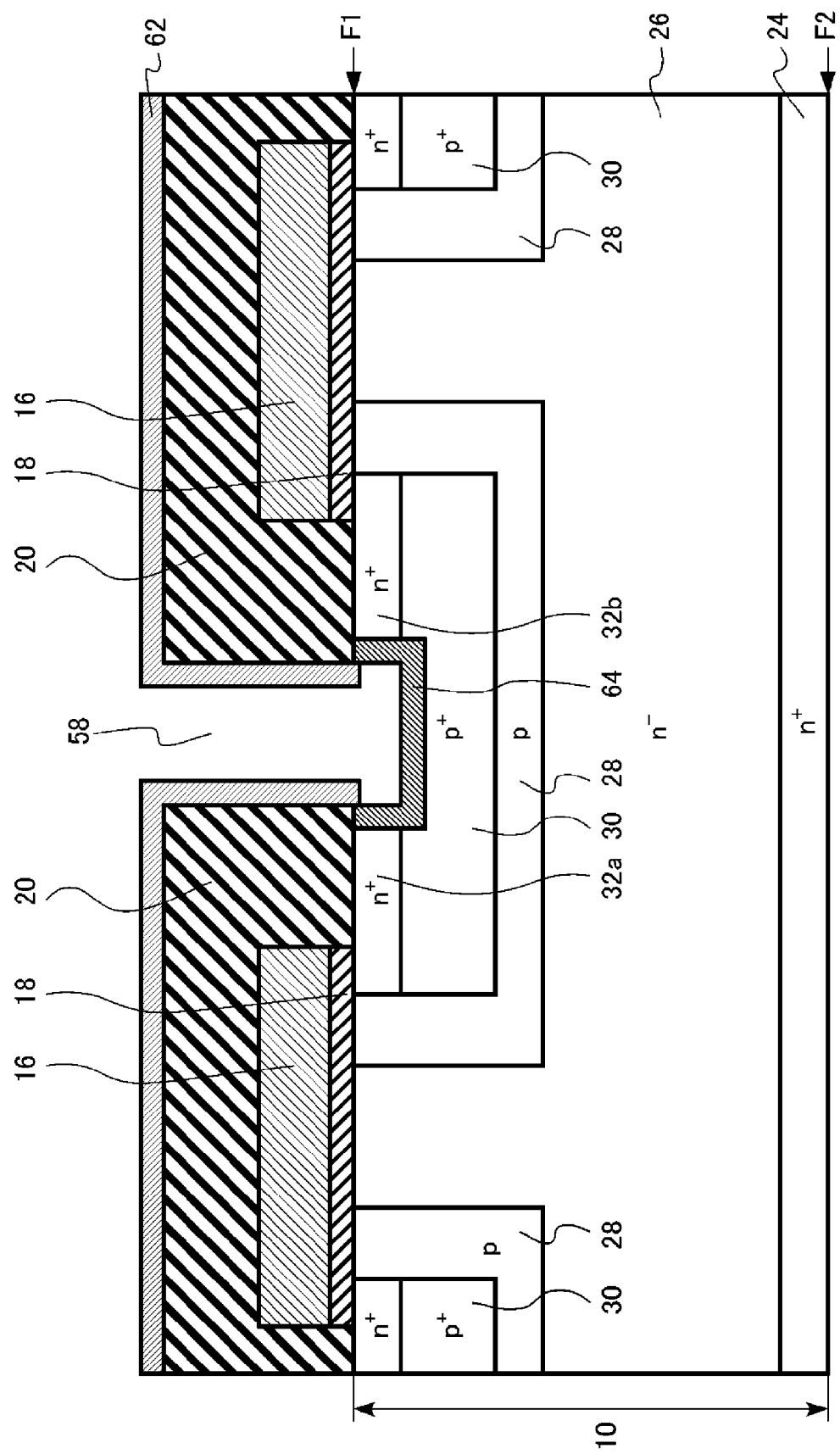

Next, heat treatment is performed to form a nickel silicide layer 64 (FIG. 13). The nickel silicide layer 64 is formed by reaction of the nickel film 62 with the silicon carbide layer 10 exposed on the inner surface of the trench 60. The nickel silicide layer 64 is an example of a metal silicide layer.

Figure 14:
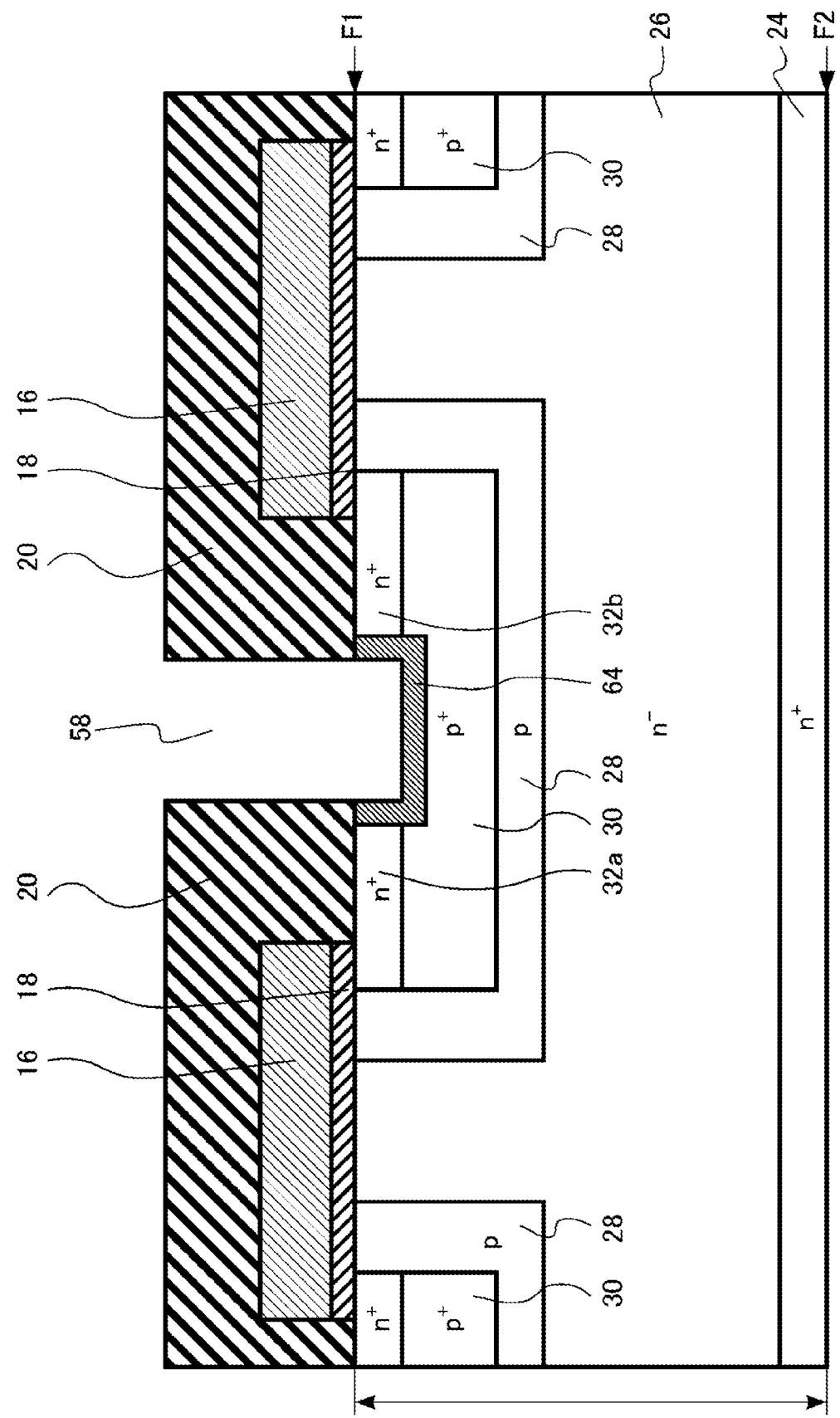

Next, the unreacted nickel film 62 is removed (FIG. 14). The nickel film 62 is removed by, for example, wet etching.

Then, the source electrode 12 is formed on the front surface side of the silicon carbide layer 10, and the drain electrode 14 is formed on the back surface side of the silicon carbide layer 10 using standard processing techniques.

The MOSFET 100 illustrated in FIGS. 1 and 2 can be formed by the above manufacturing method.

Next, the operation and effects of the semiconductor device according to the first embodiment and the method of manufacturing the semiconductor device will be described.

In a MOSFET using silicon carbide, it is desired to reduce the contact resistance of a source electrode. In an n-channel MOSFET, for example, by reducing the contact resistance between the source electrode and an n-type source region, the on-resistance is reduced, thereby reducing a steady state loss. Further, in the n-channel MOSFET, for example, by reducing the contact resistance between the source electrode and a p-type body region, implantation of carriers into the p-type body region and discharge of carriers from the p-type body region are promoted, thereby reducing a switching loss.

Figure 15:
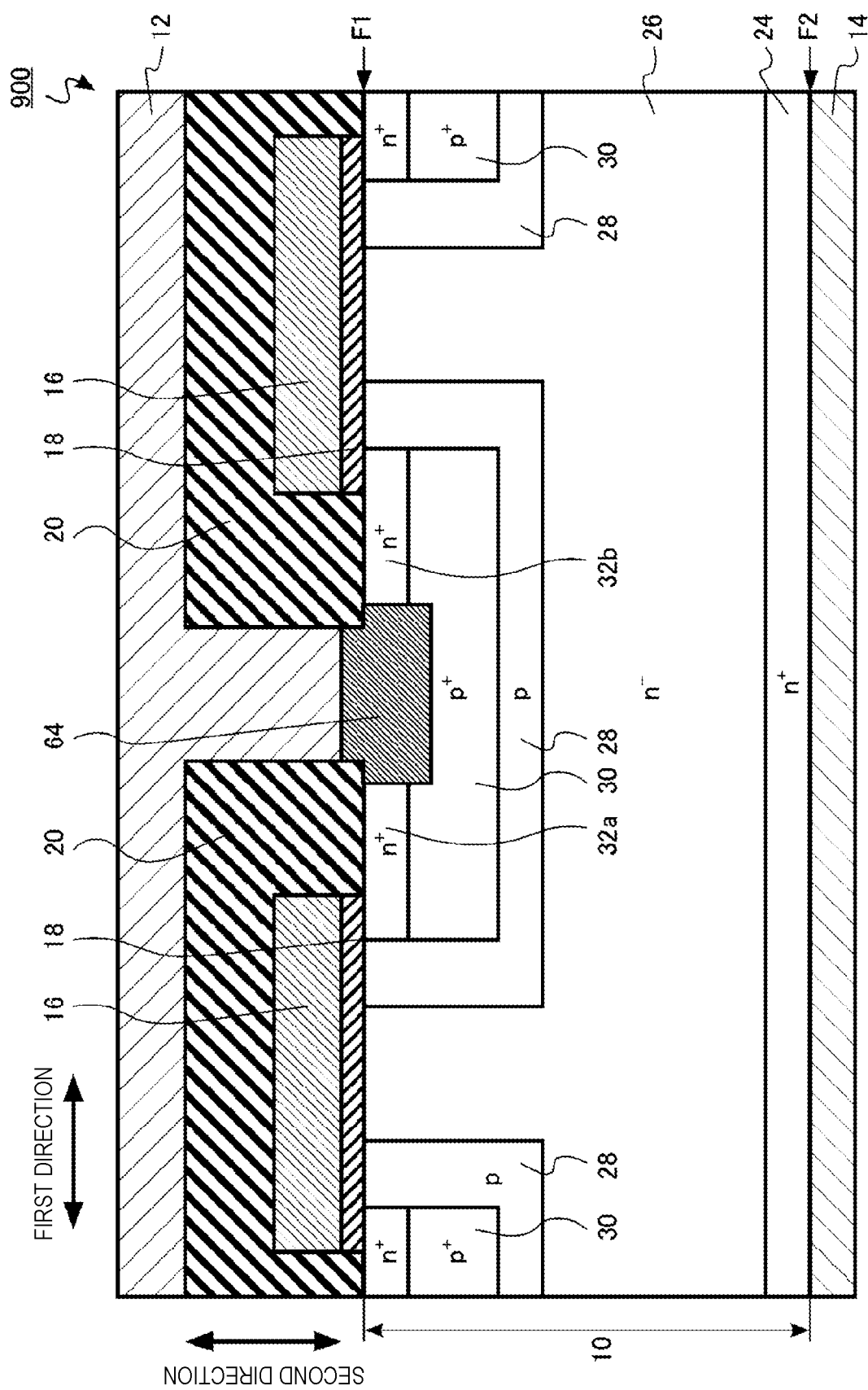
FIG. 15 is a schematic cross-sectional view of a comparative example of the semiconductor device according to the first embodiment.

FIG. 15 is a schematic cross-sectional view of a comparative example of the semiconductor device according to the first embodiment. FIG. 15 corresponds to FIG. 1 illustrating the semiconductor device according to the first embodiment.

The comparative example of the semiconductor device according to the first embodiment is a MOSFET 900. The MOSFET 900 is different from the MOSFET 100 according to the first embodiment in that the source electrode 12 does not include the first portion 12a provided between the first source region 32a and the second source region 32b in the first direction.

In the MOSFET 900, only the metal silicide layer 22 exists between the first source region 32a and the second source region 32b in the first direction. The thickness of the metal silicide layer 22 of the MOSFET 900 in the second direction is thicker than the thickness of the metal silicide layer 22 of the MOSFET 100 of the first embodiment in the second direction. The position of the interface between the source electrode 12 and the metal silicide layer 22 of the MOSFET 900 in the second direction is above the first face F1 in the second direction.

In the MOSFET 900, by providing the metal silicide layer 22 between the source electrode 12 and the n⁺-type first source region 32a, the contact resistance between the source electrode 12 and the n⁺-type first source region 32a is reduced. Further, by providing the metal silicide layer 22 between the source electrode 12 and the n⁺-type second source region 32b, the contact resistance between the source electrode 12 and the n⁺-type second source region 32b is reduced. Further, in the MOSFET 900, by providing the metal silicide layer 22 between the source electrode 12 and the p+-type contact region 30, the contact resistance between the source electrode 12 and the contact region 30 is reduced.

Next, an example of a manufacturing method of the comparative example of the semiconductor device according to the first embodiment will be described.

Figure 16:
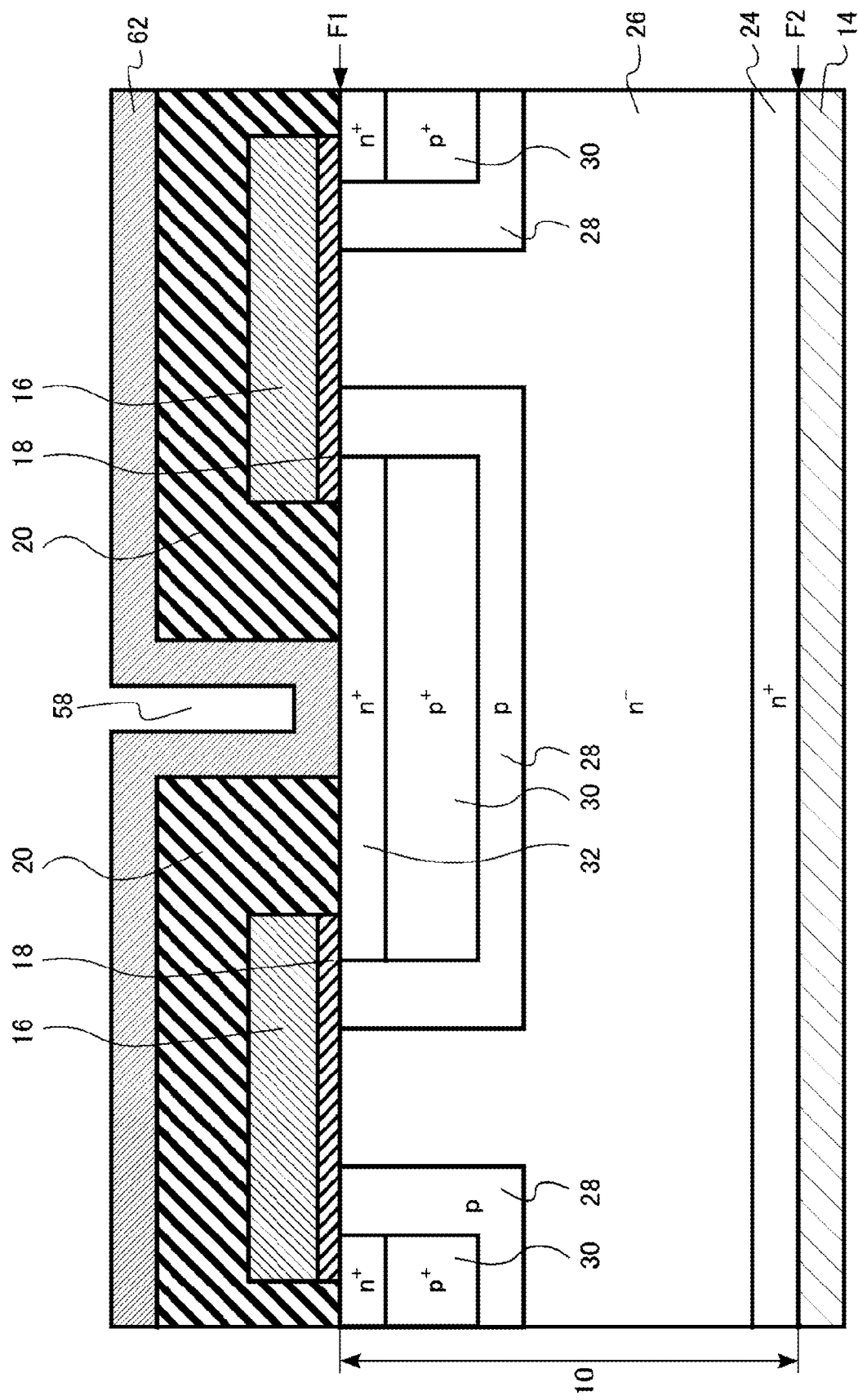
FIG. 16 is a schematic cross-sectional view illustrating an example of a manufacturing method of the comparative example of the semiconductor device according to the first embodiment.
Figure 17:
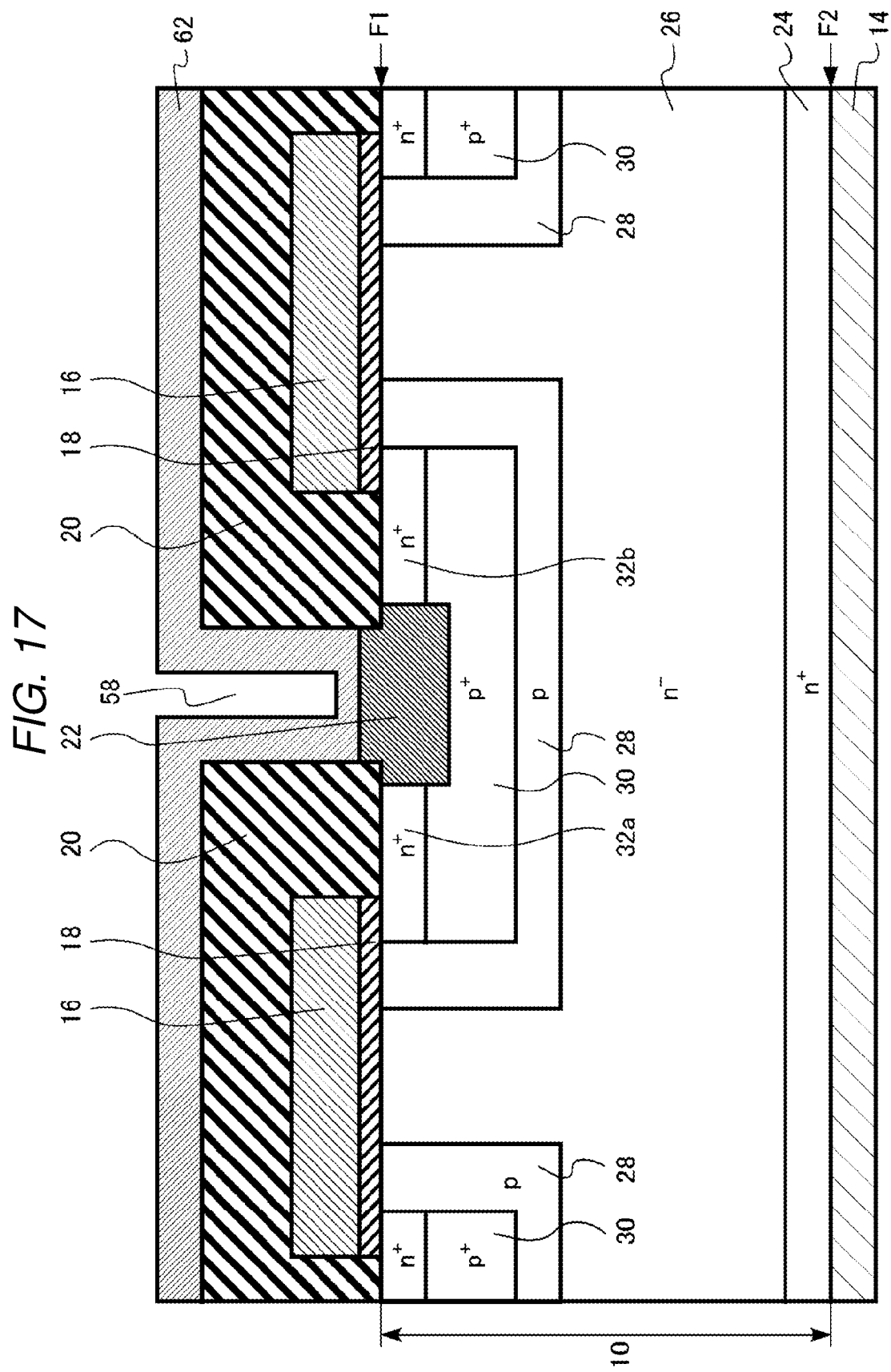
FIG. 17 is a schematic cross-sectional view illustrating an example of a manufacturing method of the comparative example of the semiconductor device according to the first embodiment.

FIGS. 16 and 17 are schematic cross-sectional views illustrating an example of a manufacturing method of the comparative example of the semiconductor device according to the first embodiment. FIGS. 16 and 17 are cross-sectional views corresponding to FIG. 15. Hereinafter, some descriptions of the contents overlapping with the method of manufacturing the semiconductor device according to the first embodiment will be omitted.

The same method for manufacturing the semiconductor device according to the first embodiment can be applied until the opening 58 is formed in the interlayer insulating layer 20.

Next, the nickel film 62 is formed under the opening 58 without forming the trench 60 thereunder (FIG. 16). The film thickness of the nickel film 62 is thicker than the film thickness of the nickel film 62 of the manufacturing method of the first embodiment. The film thickness of the nickel film 62 is, for example, 150 nm or more.

Next, heat treatment is performed to form the nickel silicide layer 64 (FIG. 17). The nickel silicide layer 64 is formed so as to have a thickness in contact with the contact region 30 in order to electrically connect the source electrode 12 and the contact region 30. The thickness of the nickel silicide layer 64 in the second direction is thicker than the thickness of the nickel silicide layer 64, which is manufactured by the manufacturing method of the first embodiment, in the second direction.

After this, the MOSFET 900 illustrated in FIG. 15 can be formed by the same manufacturing method as that of the first embodiment.

When manufacturing the MOSFET 900, stress generated by the formation of the thick nickel silicide layer 64 is applied to the silicon carbide layer 10 and the interlayer insulating layer 20. Therefore, for example, cracks may occur in the interlayer insulating layer 20. When the cracks occur in the interlayer insulating layer 20, for example, the source electrode 12 and the gate electrode 16 are electrically short-circuited, which causes a problem.

In the manufacturing method of the comparative example, for example, when the thickness of the nickel film 62 is reduced in order to reduce the stress, the bottom surface of the nickel silicide layer 64 does not reach the contact region 30, and thus the electrical connection between the source electrode 12 and the contact region 30 may not be obtained. Even if the bottom surface of the nickel silicide layer 64 reaches the contact region 30, the bottom surface of the nickel silicide layer 64 does not reach a region in the contact region 30 where the aluminum concentration is high, and thus the contact resistance between the source electrode 12 and the contact region 30 becomes high, which causes a problem.

In the manufacturing method of the comparative example, it can be considered that even when the depth of the source region 32 in the second direction is made shallow and the film thickness of the nickel film 62 is thin, the bottom surface of the nickel silicide layer 64 reaches the contact region 30. However, in this case, the contact area between the side surface of the nickel silicide layer 64 and the first source region 32a/the second source region 32b becomes smaller, and thus the contact resistance between the source electrode 12 and the first source region 32a/the second source region 32b becomes high, which causes a problem.

In the MOSFET 100 of the first embodiment, the thickness of the metal silicide layer 22 is thinner than that of the MOSFET 900 of the comparative example. Therefore, the stress generated by the formation of the metal silicide layer 22 can be reduced. Therefore, it is possible to provide the MOSFET 100 in which cracks in the interlayer insulating layer 20 are prevented, and the contact resistance is reduced. Further, the depth of the first source region 32a and the second source region 32b can be increased, and thus the diffusion resistance of the first source region 32a and the second source region 32b can be reduced. Therefore, it is possible to provide the MOSFET 100 with reduced on-resistance.

The thin MOSFET 100 of the metal silicide layer 22 can be provided by applying a manufacturing method of forming the trench 60 in the silicon carbide layer 10 before forming the metal film.

The thickness (t1 in FIG. 2) of the metal silicide layer 22 between the first portion 12a and the contact region 30 in the second direction is preferably 30 nm to 90 nm, more preferably 40 nm to 80 nm. By exceeding the lower limit value, the contact resistance between the source electrode 12 and the contact region 30 is further reduced. By staying below the upper limit value, the stress is further reduced when forming the metal silicide layer 22.

The thickness (t1 in FIG. 2) of the metal silicide layer 22 between the first portion 12a and the contact region 30 in the second direction is preferably thicker than the thickness (t2 in FIG. 2) of the metal silicide layer 22 between the first portion 12a and the first source region 32a in the first direction. The interfacial resistance between silicon carbide and metal silicide is less likely to be reduced when the silicon carbide is p-type than when the silicon carbide is n-type. By making the thickness of the metal silicide layer 22 in contact with the p-type contact region 30 relatively thick, the contact resistance between the source electrode 12 and the contact region 30 is further reduced.

In the depth direction of the metal silicide layer 22, a distance in the depth direction between a position where the p-type impurity concentration in the contact region 30 is maximized and an interface between the metal silicide layer 22 and the contact region 30 is preferably 50 nm or less, more preferably 30 nm or less. By staying below the upper limit value, the contact resistance between the source electrode 12 and the contact region 30 is further reduced.

According to the manufacturing method according to the first embodiment, by adjusting the depth of the trench 60, it is possible to easily adjust the distance in the depth direction between the position where the p-type impurity concentration in the contact region 30 is maximized and the interface between the metal silicide layer 22 and the contact region 30.

The distance in the second direction from the first face F1 to the interface between the first source region 32a and the contact region 30 is preferably 80 nm or more, more preferably 100 nm or more. That is, the depth of the first source region 32a is preferably 80 nm or more, more preferably 100 nm or more. By exceeding the lower limit value, the contact resistance between the source electrode 12 and the first source region 32a may be further reduced. For the same reason, the distance in the second direction from the first face F1 to the interface between the second source region 32b and the contact region 30 is preferably 80 nm or more, more preferably 100 nm or more.

From the viewpoint of reducing the contact resistance between the source electrode 12 and the first source region 32a, the depth of the first source region 32a is preferably ½ or more, more preferably ¾ or more, of the depth of the metal silicide layer 22. From the viewpoint of reducing the contact resistance between the source electrode 12 and the first source region 32a, the length of the second distance d2 is preferably ½ or more, more preferably ¾ or more, of the third distance d3.

(Modification)

A modification of the semiconductor device according to the first embodiment is different from the first embodiment in that an interface between the fourth silicon carbide region and the metal silicide layer is inclined with respect to the second direction and an interface between the fifth silicon carbide region and the metal silicide layer is inclined with respect to the second direction.

This modification of the first embodiment is depicted as a MOSFET 101.

Figure 18:
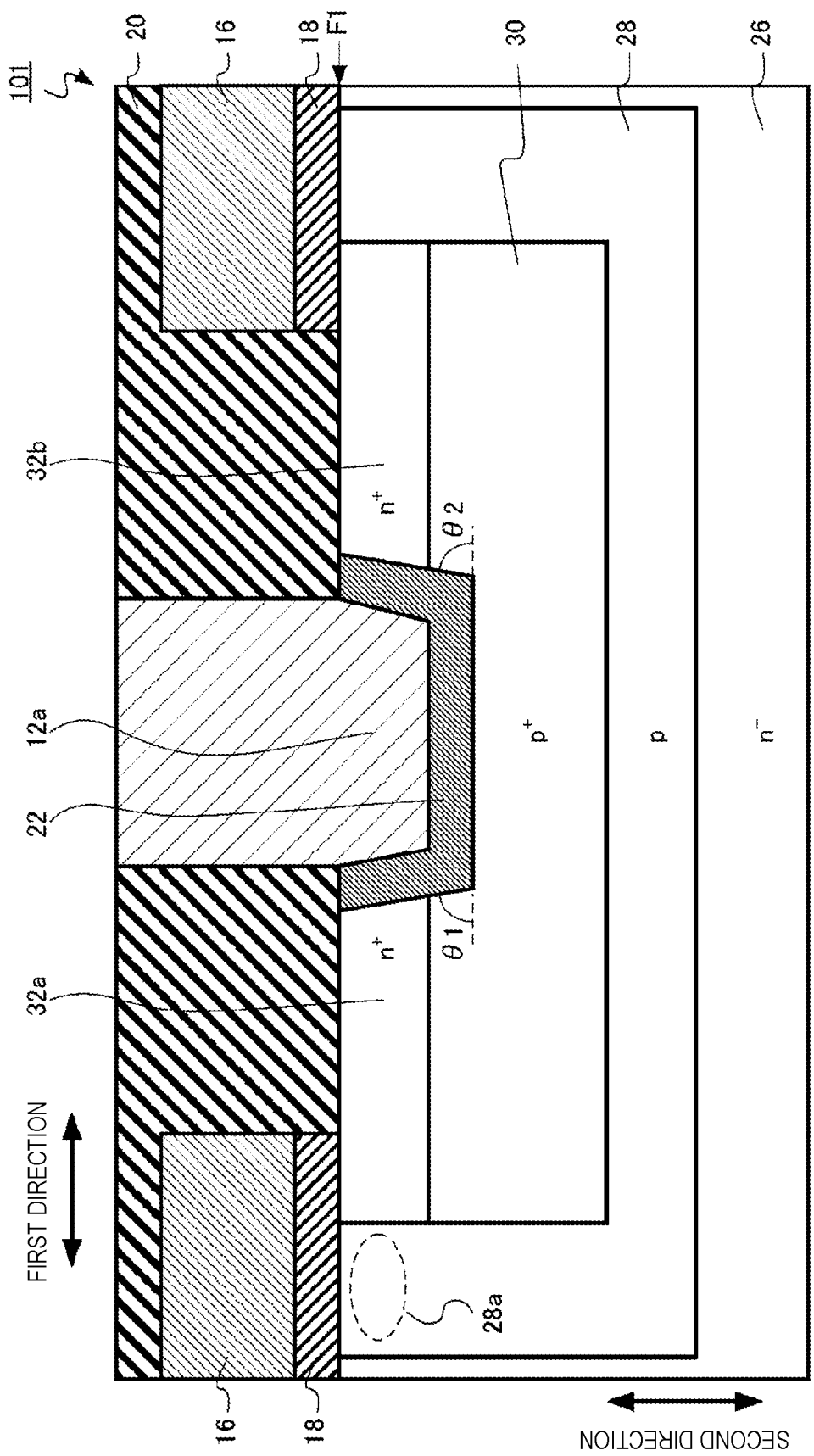
FIG. 18 is an enlarged schematic cross-sectional view of a modification of the semiconductor device according to a first embodiment.

FIG. 18 is an enlarged schematic cross-sectional view of a modification of the semiconductor device according to the first embodiment. FIG. 18 is a view corresponding to FIG. 2 of the first embodiment.

The interface between the first source region 32a and the metal silicide layer 22 is inclined with respect to the second direction. The interface between the first source region 32a and the metal silicide layer 22 has a forward tapered shape. An angle θ1 between the interface between the first source region 32a and the metal silicide layer 22 and a face parallel to the first face F1 is, for example, 75 degrees to 85 degrees.

Since the interface between the first source region 32a and the metal silicide layer 22 has the tapered shape, the area of the interface between the first source region 32a and the metal silicide layer 22 becomes large. Therefore, the contact resistance between the source electrode 12 and the first source region 32a is reduced.

The interface between the second source region 32b and the metal silicide layer 22 is inclined with respect to the second direction. The interface between the second source region 32b and the metal silicide layer 22 has a forward tapered shape. An angle θ2 between the interface between the second source region 32b and the metal silicide layer 22 and a face parallel to the first face F1 is, for example, 75 degrees to 85 degrees.

Since the interface between the second source region 32b and the metal silicide layer 22 has the tapered shape, the area of the interface between the second source region 32b and the metal silicide layer 22 becomes large. Therefore, the contact resistance between the source electrode 12 and the second source region 32b is reduced.

Second Embodiment

A semiconductor device according to a second embodiment is different from the semiconductor device according to the first embodiment in that the silicon carbide layer further includes a first conductivity type sixth silicon carbide region provided between the second silicon carbide region and the first face in the second direction, provided between the second region and the fourth silicon carbide region in the first direction, configured to be in contact with the first face, facing the gate electrode, and having a first conductivity type impurity concentration lower than the first conductivity type impurity concentration in the fourth silicon carbide region. Unless otherwise stated, the second embodiment can be considered to correspond to description of the first embodiment.

Figure 19:
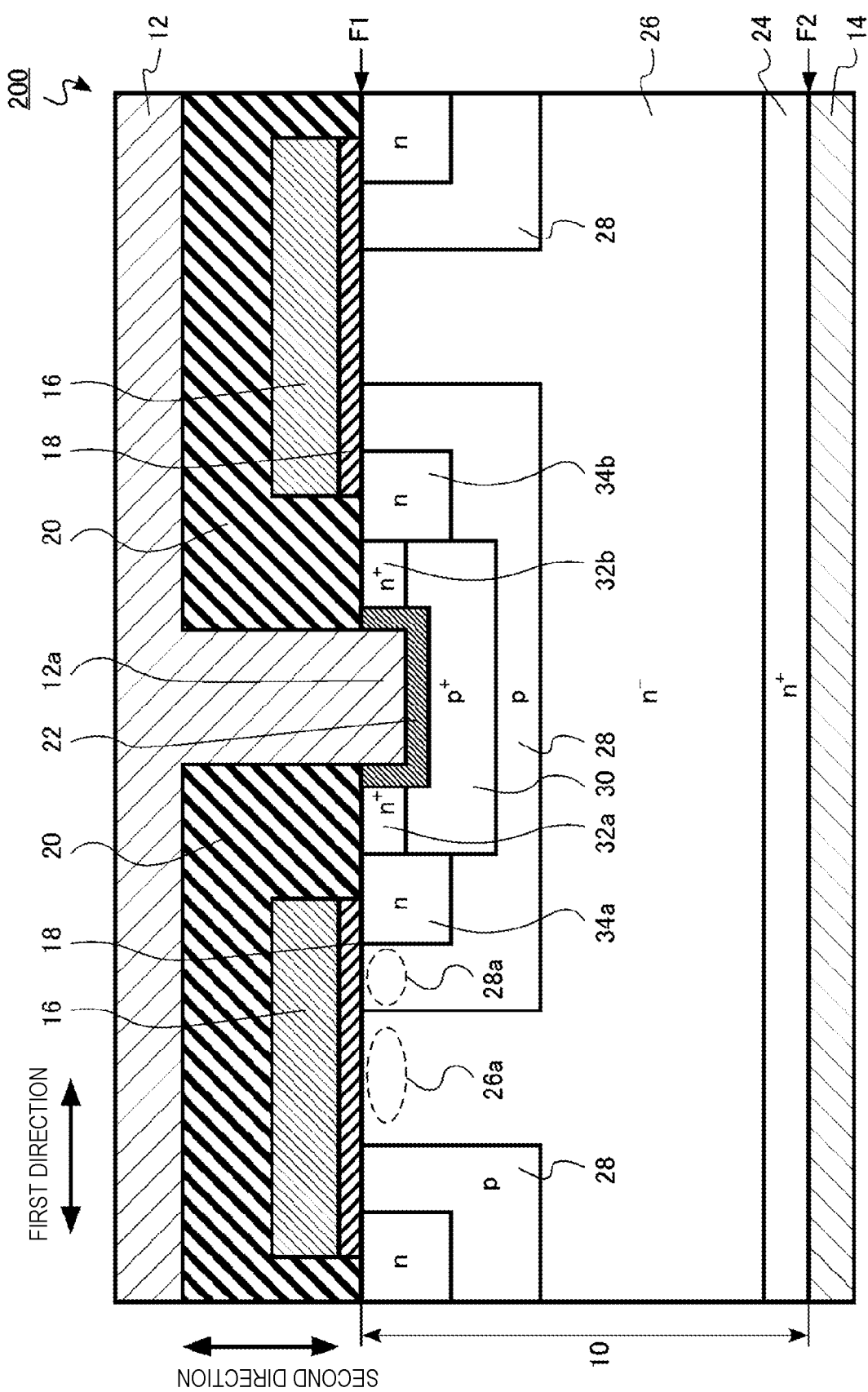
FIG. 19 is a schematic cross-sectional view of a semiconductor device according to a second embodiment.

The semiconductor device according to the second embodiment is depicted as a MOSFET 200 in FIG. 19. The MOSFET 200 is a DIMOSFET. The MOSFET 200 is an n-channel MOSFET having electrons as carriers.

Figure 20:
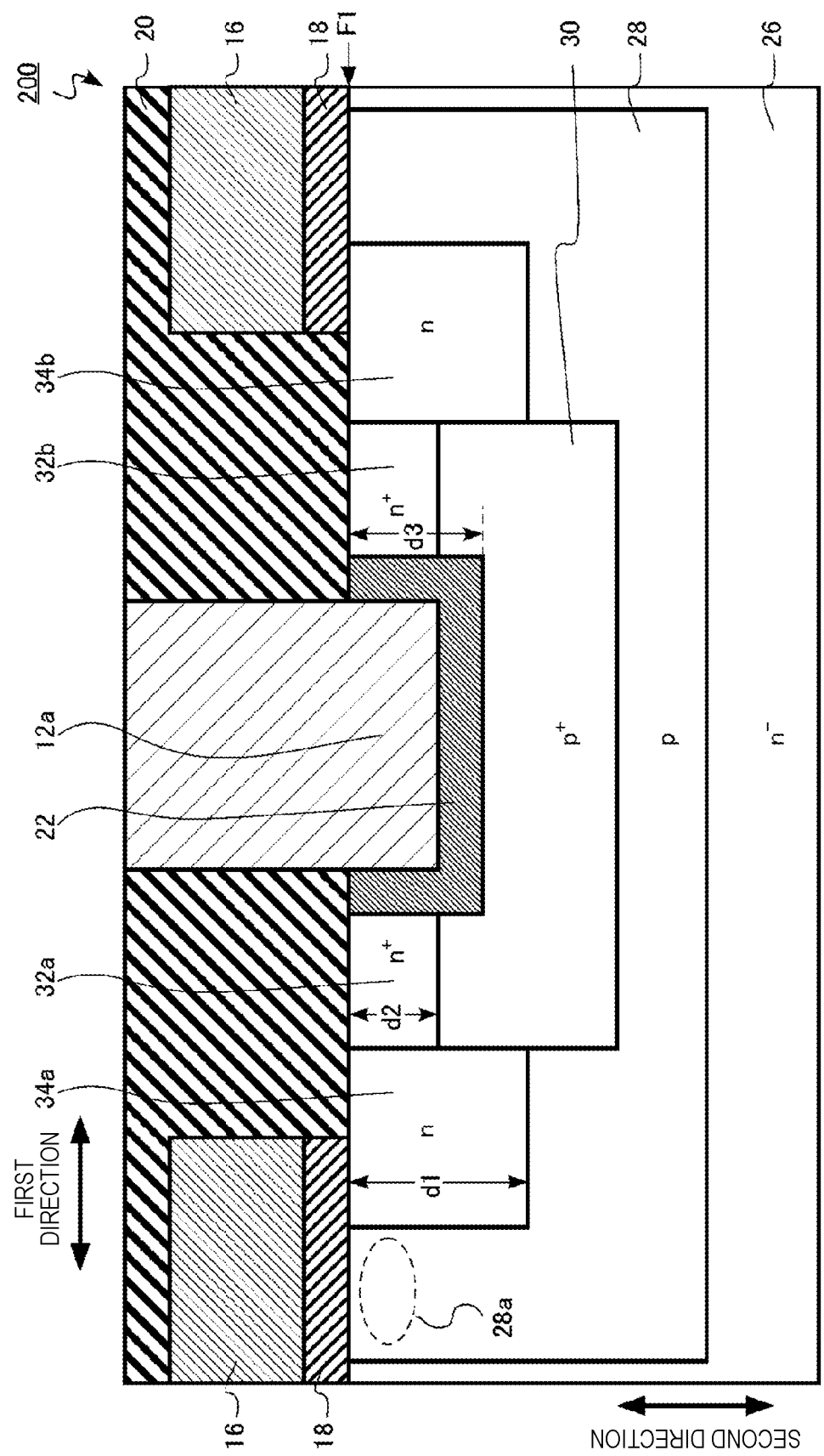
FIG. 20 is an enlarged schematic cross-sectional view of a semiconductor device according to a second embodiment.

FIG. 19 is a schematic cross-sectional view of the semiconductor device according to the second embodiment. FIG. 20 is an enlarged schematic cross-sectional view of the semiconductor device according to the second embodiment. FIG. 20 is an enlarged cross-sectional view of a portion of FIG. 19.

The MOSFET 200 includes a silicon carbide layer 10, a source electrode 12, a drain electrode 14, a gate electrode 16, a gate insulating layer 18, an interlayer insulating layer 20 (, and a metal silicide layer 22. The source electrode 12 includes a first portion 12a.

The silicon carbide layer 10 includes an n$^+$-type drain region 24, an n$^-$-type drift region 26 (first silicon carbide region), a p-type body region 28 (second silicon carbide region), a p$^+$-type contact region 30 (third silicon carbide region), an n$^+$-type first source region 32a (fourth silicon carbide region), an n$^+$-type second source region 32b (fifth silicon carbide region), an n-type first low concentration region 34a (sixth silicon carbide region), and an n-type second low concentration region 34b. The drift region 26 includes a first region 26a. The body region 28 includes a second region 28a.

The n-type first low concentration region 34a is provided between the body region 28 and the first face F1 in the second direction. The first low concentration region 34a is provided between the second region 28a of the body region 28 and the first source region 32a in the first direction.

The first low concentration region 34a is in contact with the first face F1. The first low concentration region 34a faces the gate electrode 16. The first low concentration region 34a faces the end of the gate electrode 16. The gate insulating layer 18 is provided between the first low concentration region 34a and the gate electrode 16.

The first low concentration region 34a comprises, for example, nitrogen (N) or phosphorus (P) as an n-type impurity. The n-type impurity concentration in the first low concentration region 34a is lower than the n-type impurity concentration in the first source region 32a. The n-type impurity concentration in the first low concentration region 34a is ¹⁄₁₀ or less of the n-type impurity concentration in the first source region 32a. The n-type impurity concentration in the first low concentration region 34a is, for example, $1\times10^{18}$ cm$^{-3}$ to $1\times10^{20}$ cm$^{-3}$.

The depth of the first low concentration region 34a is shallower than the depth of the body region 28. The depth of the first low concentration region 34a is, for example, 100 nm to 300 nm. A first distance d1 (FIG. 20) in the second direction from the first face F1 to an interface between the first low concentration region 34a and the body region 28 is, for example, 100 nm to 300 nm.

The depth of the first low concentration region 34a is deeper than the depth of the first source region 32a. The first distance d1 in the second direction from the first face F1 to the interface between the first low concentration region 34a and the body region 28 is longer than a second distance d2 (FIG. 20) in the second direction from the first face F1 to an interface between the first source region 32a and the contact region 30.

The depth of the metal silicide layer 22 is shallower than, for example, the depth of the first low concentration region 34a. A third distance d3 (FIG. 20) in the second direction from the first face F1 to an interface between the metal silicide layer 22 and the contact region 30 is shorter than, for example, the first distance d1 in the second direction from the first face F1 to the interface between the first low concentration region 34a and the body region 28.

The depth of the metal silicide layer 22 is, for example, deeper than the depth of the first source region 32a. The third distance d3 in the second direction from the first face F1 to the interface between the metal silicide layer 22 and the contact region 30 is longer than the second distance d2 in the second direction from the first face F1 to the interface between the first source region 32a and the contact region 30.

The n-type second low concentration region 34b is provided between the body region 28 and the first face F1 in the second direction. The second low concentration region 34b is provided between the body region 28 and the second source region 32b in the first direction.

The second low concentration region 34b is in contact with the first face F1. The second low concentration region 34b faces the gate electrode 16. The second low concentration region 34b faces the end of the gate electrode 16. The gate insulating layer 18 is provided between the second low concentration region 34b and the gate electrode 16.

The second low concentration region 34b comprises, for example, nitrogen (N) or phosphorus (P) as an n-type impurity. The n-type impurity concentration in the second low concentration region 34b is lower than the n-type impurity concentration in the second source region 32b. The n-type impurity concentration in the second low concentration region 34b is 1/10 or less of the n-type impurity concentration in the second source region 32b. The n-type impurity concentration in the second low concentration region 34b is, for example, $1 \times 10^{18}$ cm$^{-3}$ to $1 \times 10^{20}$ cm$^{-3}$.

The depth of the second low concentration region 34b is shallower than the depth of the body region 28. The depth of the second low concentration region 34b is, for example, 100 nm to 300 nm. The depth of the second low concentration region 34b is deeper than the depth of the second source region 32b.

The MOSFET 200 includes the n-type first low concentration region 34a facing the end of the gate electrode 16. The n-type impurity concentration in the first low concentration region 34a is lower than the n-type impurity concentration in the first source region 32a. Therefore, an electric field applied to the gate insulating layer 18 under the end of the gate electrode 16 is relaxed as compared with that of the MOSFET 100 of the first embodiment in which the end of the gate electrode 16 faces the first source region 32a. Therefore, the reliability of the gate insulating layer 18 is improved.

The MOSFET 200 includes the n-type second low concentration region 34b facing the end of the gate electrode 16. The n-type impurity concentration in the second low concentration region 34b is lower than the n-type impurity concentration in the second source region 32b. Therefore, the electric field applied to the gate insulating layer 18 under the end of the gate electrode 16 is relaxed as compared with that of the MOSFET 100 of the first embodiment in which the end of the gate electrode 16 faces the first source region 32a. Therefore, the reliability of the gate insulating layer 18 is improved.

In the MOSFET 200, the depth of the first low concentration region 34a is deeper than the depth of the first source region 32a. Further, the depth of the second low concentration region 34b is deeper than the depth of the second source region 32b. Therefore, the increase in the on-resistance of the MOSFET 200 is prevented.

(Modification)

A modification of the semiconductor device according to the second embodiment is different from the semiconductor device according to the second embodiment in that the first distance in the second direction from the first face to the interface between the sixth silicon carbide region and the second silicon carbide region is shorter than the second distance in the second direction from the first face to the interface between the fourth silicon carbide region and the third silicon carbide region.

This modification of the semiconductor device according to the second embodiment is depicted as a MOSFET 201 in FIG. 21.

FIG. 21 is an enlarged schematic cross-sectional view of a modification of the semiconductor device according to the second embodiment. FIG. 21 is a view corresponding to FIG. 20.

The depth of the first low concentration region 34a is shallower than the depth of the body region 28. The depth of the first low concentration region 34a is, for example, 40 nm to 100 nm. A first distance d1 (FIG. 21) in the second direction from the first face F1 to the interface between the first low concentration region 34a and the body region 28 is, for example, 100 nm to 300 nm.

The depth of the first low concentration region 34a is shallower than the depth of the first source region 32a. The first distance d1 in the second direction from the first face F1 to the interface between the first low concentration region 34a and the body region 28 is shorter than a second distance d2 (FIG. 21) in the second direction from the first face F1 to an interface between the first source region 32a and the contact region 30.

The depth of the second low concentration region 34b is shallower than the depth of the body region 28. The depth of the second low concentration region 34b is, for example, 40 nm to 100 nm. The depth of the second low concentration region 34b is shallower than the depth of the second source region 32b.

In the MOSFET 201, an electric field applied to the gate insulating layer 18 under the end of the gate electrode 16 is relaxed. Therefore, the reliability of the gate insulating layer 18 is improved.

As described above, in the first and second embodiments and the modifications thereof, the case of 4H—SiC as the crystal structure of silicon carbide is described as one example, but the present disclosure may also be applied to silicon carbide having other crystal structures such as 6H—SiC and 3C—SiC.

Furthermore, in the first and second embodiments, a case where the first conductivity type is n-type and the second conductivity type is p-type was described as an example, but the first conductivity type can be switched/reversed to p-type and similarly the second conductivity type to n-type. In this case, the MOSFET is of a p-channel type.

In the first and second embodiments, the gate electrode extends in the direction parallel to the first face F1 and perpendicular to the first direction, but the pattern of the gate electrode is particularly not limited. For example, the pattern of the gate electrode may be a mesh pattern.

It is also possible to apply the present disclosure to an integrated gate bipolar transistor (IGBT).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a silicon carbide layer having a first face and a second face spaced from the first face, the silicon carbide layer including:
a first silicon carbide region of a first conductivity type having a first region in contact with the first face,
a second silicon carbide region of a second conductivity type between the first silicon carbide region and the first face and having a second region in contact with the first face,
a third silicon carbide region of the second conductivity type between the second silicon carbide region and the first face and having a second conductivity type impurity concentration that is higher than a second conductivity type impurity concentration of the second silicon carbide region,
a fourth silicon carbide region of the first conductivity type between the third silicon carbide region and the first face and in contact with the first face, and
a fifth silicon carbide region of the first conductivity type between the third silicon carbide region and the first face and in contact with the first face, the fifth silicon carbide region being in a first direction from the fourth silicon carbide region, the first direction parallel to the first face;
a gate electrode on a first face side of the silicon carbide layer, the gate electrode facing the first region and the second region;
a gate insulating layer between the first region and the gate electrode and between the second region and the gate electrode;
a first electrode on the first face side of the silicon carbide layer and including a first portion between the fourth silicon carbide region and the fifth silicon carbide region in the first direction;
a second electrode on a second face side of the silicon carbide layer; and
a metal silicide layer between the first portion and the third silicon carbide region and in contact with the third silicon carbide region, the metal silicide layer being between the first portion and the fourth silicon carbide region and in contact with the fourth silicon carbide region, and between the first portion and the fifth silicon carbide region and in contact with the fifth silicon carbide region.

2. The semiconductor device according to claim 1, wherein the silicon carbide layer further includes:
a sixth silicon carbide region of the first conductivity type between the second silicon carbide region and the first face in a second direction from the first face towards the second face, the sixth silicon carbide region being between the second region and the fourth silicon carbide region in the first direction and in contact with the first face, the sixth silicon carbide region facing the gate electrode and having a first conductivity type impurity concentration lower than a first conductivity type impurity concentration of the fourth silicon carbide region.

3. The semiconductor device according to claim 2, wherein a first distance along the second direction from the first face to an interface between the sixth silicon carbide region and the second silicon carbide region is longer than a second distance along the second direction from the first face to an interface between the fourth silicon carbide region and the third silicon carbide region.

4. The semiconductor device according to claim 3, wherein a third distance along the second direction from the first face to an interface between the metal silicide layer and the third silicon carbide region is shorter than the first distance but longer than the second distance.

5. The semiconductor device according to claim 1, wherein a distance from the first face to an interface between the metal silicide layer and the third silicon carbide region is at least 200 nm.

6. The semiconductor device according to claim 1, wherein a thickness of the metal silicide layer between the first portion and the third silicon carbide region is in a range of 30 nm to 90 nm.

7. The semiconductor device according claim 1, wherein a thickness of the metal silicide layer between the first portion and the third silicon carbide region is greater than a thickness of the metal silicide layer between the first portion and the fourth silicon carbide region.

8. The semiconductor device according to claim 1, wherein a distance between the maximum second conductivity type impurity concentration in the third silicon carbide region and the interface between the metal silicide layer and the third silicon carbide region is 50 nm or less.

9. The semiconductor device according to claim 1, wherein an interface between the fourth silicon carbide region and the metal silicide layer is angled at greater than 90 degrees with respect to the first face.

10. The semiconductor device according to claim 1, wherein
the metal silicide layer is a nickel silicide layer, and
the first electrode comprises aluminum (Al).

11. The semiconductor device according to claim 1, further comprising:
an insulating layer between the gate electrode and the first electrode in the first direction.

12. A semiconductor device, comprising:
a silicon carbide layer;
a gate electrode on a first side of the silicon carbide layer;
a first electrode on the first side of the silicon carbide layer, the first electrode including a first portion for electrically contacting the silicon carbide layer, the first portion spaced from the gate electrode in a first direction;
a second electrode on a second side of the silicon carbide layer spaced from the first side in a second direction; and
a metal silicide layer between the first portion and the silicon carbide layer, wherein
the silicon carbide layer includes:
a first silicon carbide region of a first conductivity type and having a first region that is at a first surface of the silicon carbide layer and below the gate electrode in the second direction,
a second silicon carbide region of a second conductivity type adjacent to the first silicon carbide region in the first and second directions, the second silicon carbide region having a second region at the first surface and below the gate electrode in the second direction,
a third silicon carbide region of the second conductivity type adjacent to the second silicon carbide region in the first and second direction and having a second conductivity type impurity concentration that is higher than a second conductivity type impurity concentration of the second silicon carbide region, a fourth silicon carbide region of the first conductivity type between the third silicon carbide region and the first surface in the second direction, the fourth silicon carbide region contacting the metal silicide layer, and a fifth silicon carbide region of the first conductivity type between the third silicon carbide region and the first surface in the second direction, the fifth silicon carbide region contacting the metal silicide layer, the first portion of the first electrode being between the fourth and fifth silicon carbide regions in the first direction.

13. The semiconductor device according to claim 12, further comprising:

an insulating layer between the gate electrode and the first electrode in the first direction.

14. The semiconductor device according to claim 12, wherein a thickness of the metal silicide layer between the first portion and the third silicon carbide region is in a range of 30 nm to 90 nm.

15. The semiconductor device according claim 12, wherein a thickness of the metal silicide layer between the first portion and the third silicon carbide region is greater than a thickness of the metal silicide layer between the first portion and the fourth silicon carbide region.

16. The semiconductor device according to claim 12, wherein an interface between the fourth silicon carbide region and the metal silicide layer is angled at greater than 90 degrees with respect to the first face.

17. The semiconductor device according to claim 12, further comprising:

a gate insulating layer between the gate electrode and the first surface.

* * * * *